(12) United States Patent
Ushinaga

(10) Patent No.: US 10,186,547 B2
(45) Date of Patent: Jan. 22, 2019

(54) SOLID-STATE IMAGING ELEMENT AND METHOD OF MANUFACTURING THE SAME

(71) Applicant: Sharp Kabushiki Kaisha, Osaka (JP)

(72) Inventor: Takeo Ushinaga, Osaka (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 0 days.

(21) Appl. No.: 14/379,061

(22) PCT Filed: Feb. 21, 2013

(86) PCT No.: PCT/JP2013/054316
§ 371 (c)(1),
(2) Date: Aug. 15, 2014

(87) PCT Pub. No.: WO2013/125631
PCT Pub. Date: Aug. 29, 2013

(65) Prior Publication Data
US 2015/0014749 A1    Jan. 15, 2015

(30) Foreign Application Priority Data

Feb. 23, 2012 (JP) ................. 2012-037209

(51) Int. Cl.
*H01L 27/146* (2006.01)
*H01L 27/148* (2006.01)
*H01L 31/0352* (2006.01)

(52) U.S. Cl.
CPC .... *H01L 27/14812* (2013.01); *H01L 27/1461* (2013.01); *H01L 27/14612* (2013.01); *H01L 27/14616* (2013.01); *H01L 31/03529* (2013.01)

(58) Field of Classification Search
CPC ................................................ H01L 27/1461
(Continued)

(56) References Cited

U.S. PATENT DOCUMENTS

2002/0100887 A1    8/2002 Hagiwara et al.
2010/0237390 A1*   9/2010 Kenichi ............ H01L 27/14609
                                                        257/226

FOREIGN PATENT DOCUMENTS

| JP | 05-347401  | 12/1993 |
| JP | 2000-236081 | 8/2000 |
| JP | 2002-231926 | 8/2002 |

* cited by examiner

*Primary Examiner* — Hsin-Yi Hsieh
(74) *Attorney, Agent, or Firm* — Keating & Bennett, LLP

(57) ABSTRACT

Provided are a solid-state imaging element which can be simply manufactured and can control movement of electric charges in an accumulation region with a high degree of accuracy, and a method of manufacturing the same. A solid-state imaging element (1a) includes a substrate (11) having a first conductivity type; an accumulation region (12) having a second conductivity type and provided in the substrate (11); a read-out region (13) for receiving the transferred electric charges accumulated in the accumulation region (12); and a transfer section (14) for transferring the electric charges from the accumulation region (12) to the read-out region (13). An impurity concentration modulation region 121 having a locally high concentration of an impurity having the second conductivity type, or having a locally low concentration of an impurity having the first conductivity type is formed in a part of the accumulation region (12). An area of the impurity concentration modulation region (121) per unit distance with respect to the transfer section (14), or a density of the discretely provided impurity concentration modulation region (121) increases with decreasing distance to the transfer section (14).

5 Claims, 22 Drawing Sheets

(58) Field of Classification Search
USPC .......................................................... 257/222
See application file for complete search history.

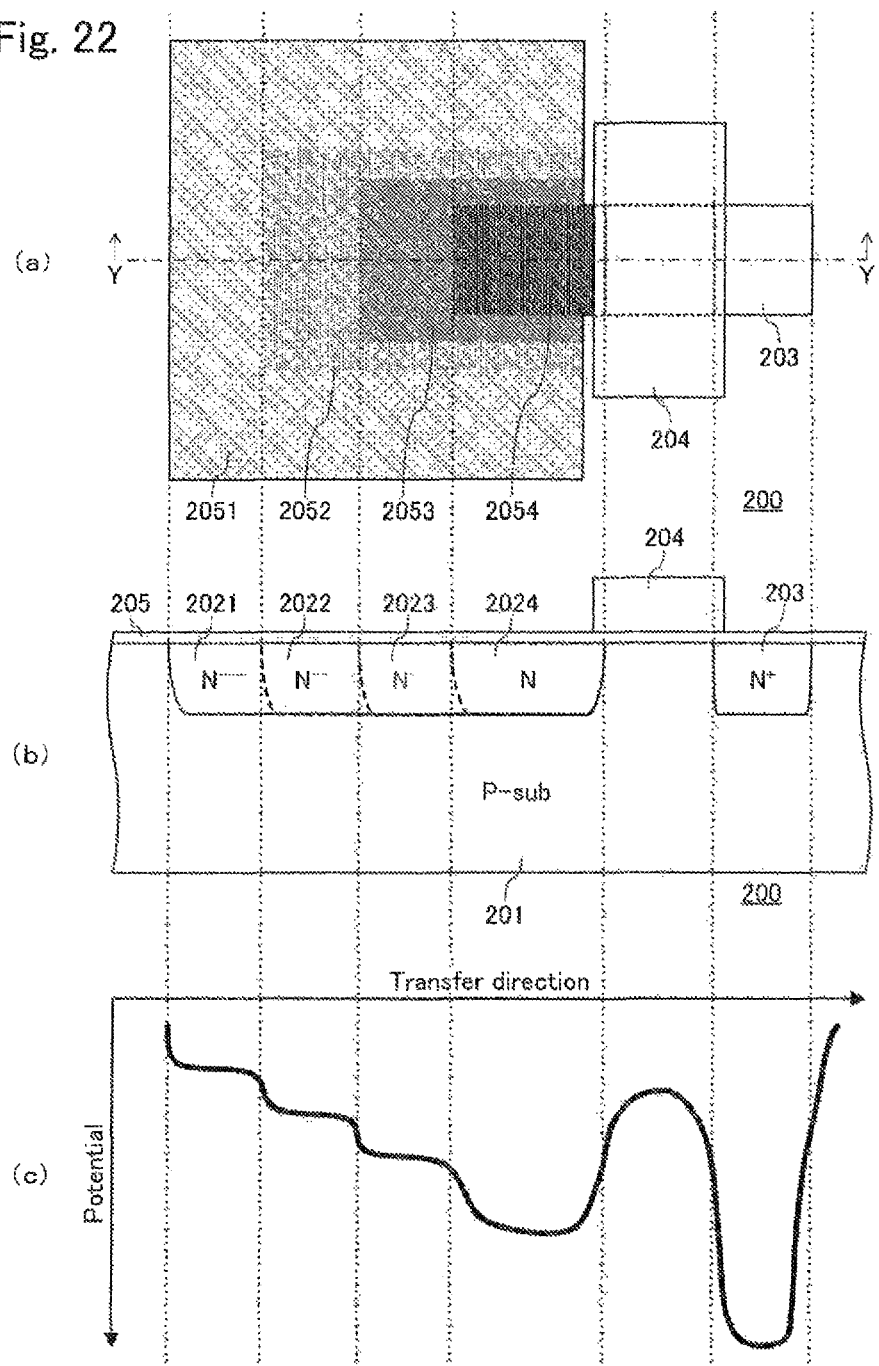

SOLID-STATE IMAGING ELEMENT AND METHOD OF MANUFACTURING THE SAME

CROSS-REFERENCE TO RELATED APPLICATIONS

This application is a National Phase application filed under 35 USC 371 of PCT International Application No. PCT/JP2013/054316 with an International Filing Date of Feb. 21, 2013, which claims under 35 U.S.C. § 119(a) the benefit of Japanese Application No. 2012-037209, filed Feb. 23, 2012, the entire contents of which are incorporated herein by reference.

TECHNICAL FIELD

The present invention relates to a solid-state imaging element typified by a CMOS (Complementary Metal Oxide Semiconductor) imaging sensor, a CCD (Charge Coupled Device) imaging sensor, or the like.

BACKGROUND ART

The solid-state imaging element such as the CCD imaging sensor or the CMOS imaging sensor is mounted on an imaging device such as a digital video camera or a digital still camera, and is mounted on various kinds of electronic devices each having an imaging function, such as a camera cell-phone, a scanner, a copying machine, and a fax machine.

The solid-state imaging element includes a photoelectric conversion unit such as a photodiode in a substrate to generate electric charges by photoelectrically converting light inputted to the substrate. The generated electric charges are accumulated in an accumulation region in the substrate, and are subsequently transferred to a read-out region in the substrate through a transfer section. Thus, based on the charges transferred to the read-out region, one signal composing an image is generated.

Recently, it has been required to make the solid-state imaging element highly sensitive. However, when the accumulation region increases in size so that the solid-state imaging element is made highly sensitive, there is a decrease in transfer speed of the electric charges through the transfer section, which causes a problem.

This problem will be described with reference to FIG. 21. FIG. 21 is a view showing a conventional solid-state imaging element. In addition, FIG. 21 (a) is a plan view of one pixel in the solid-state imaging element, FIG. 21 (b) is a cross-sectional view showing a cross-sectional surface taken along X-X in FIG. 21 (a). Furthermore, FIG. 21 (c) is a graph showing a potential in the cross-sectional surface taken along X-X in FIG. 21 (a).

As shown in FIGS. 21 (a) and (b), a solid-state imaging element 100 includes a substrate 101, an accumulation region 102 formed in the substrate 101, for accumulating electrons generated by a photoelectric conversion, a read-out region 103 formed in the substrate 101, for receiving transferred electrons accumulated in the accumulation region 102, a transfer section 104 for transferring the electrons from the accumulation region 102 to the read-out region 103, and an insulating film 105 formed on a surface of the substrate 101. The transfer section 104 serves as a gate electrode formed on the insulating film 105 and is formed between the accumulation region 102 and the read-out region 103.

The substrate 101 has a P type (P-sub), the accumulation region 102 has an N type (N$^-$), and the read-out region 103 has the N type (N$^+$). In the solid-state imaging element 100, an N-type high-concentration impurity region 1021 (impurity concentration modulation region) having an N type (N) is formed by separately implanting an N-type impurity into an implantation region 106 which is provided in the accumulation region 102 and which is provided adjacent to the transfer section 104. Therefore, according to the solid-state imaging element 100 in the present example, a photodiode is composed of the substrate 101 and the accumulation region 102, and the electrons are accumulated in the accumulation region 102.

When a predetermined potential is applied to the transfer section 104 in this solid-state imaging element 100, the potential in the substrate 101 just below the transfer section 104 is lowered, and the electrons accumulated in the accumulation region 102 are transferred to the read-out region 103. At this time, when an area of the accumulation region 102 is large as descried above, some electrons are accumulated in a position far away from the transfer section 104, in the accumulation region 102. Thus, it takes a long time for the electrons to reach the transfer section 104.

When the N-type high-concentration impurity region 1021 is provided in the accumulation region 102, in the solid-state imaging element 100, the electrons are accumulated in the accumulation region 102. However, as shown in FIG. 21 (c), a potential in the N-type high-concentration impurity region 1021 is lower than that of a peripheral part due to the implantation of the N-type impurity, but the potential is flat. Therefore, movement of the electrons accumulated in the N-type high-concentration impurity region 1021 to the transfer section 104 is not particularly accelerated, and it takes a long time for the electrons to reach the transfer section 104.

Thus, in the case where the electrons accumulated in the accumulation region 102 cannot be completely transferred to the read-out region 103 within a predetermined read-out period, the electrons remain in the accumulation region 102, and these electrons are added to electrons to be generated by next photoelectric conversion, so that a residual image is generated in an obtained image, which is the problem.

Thus, for example, Patent Document 1 discloses a solid-state imaging element in which movement of the electrons to the transfer section is accelerated by inclining a potential in the accumulation region. This solid-state imaging element will be described with reference to FIG. 22. FIG. 22 is a view showing a conventional solid-state imaging element. In addition, FIG. 22 (a) is a plan view of one pixel in the solid-state imaging element, FIG. 22 (b) is a cross-sectional view showing a cross-sectional surface taken along Y-Y in FIG. 22 (a). Furthermore, FIG. 22 (c) is a graph showing a potential in the cross-sectional surface taken along Y-Y in FIG. 22 (a).

As shown in FIGS. 22 (a) and (b), a solid-state imaging element 200 includes a substrate 201, accumulation regions 2021 to 2024 which are formed in the substrate 201 and which accumulate electrons generated by a photoelectric conversion, a read-out region 203 which are formed in the substrate 201 and which receives the transferred electrons accumulated in the accumulation regions 2021 to 2024, a transfer section 204 for transferring the electrons from the accumulation region 2024 to the read-out region 203, and an insulating film 205 formed on a surface of the substrate 201. The transfer section 204 serves as a gate electrode formed on the insulating film 205 and is formed between the accumulation region 2024 and the read-out region 203.

The substrate 201 has the P type (P-sub), the accumulation regions 2021 to 2024 have the N type, and the read-out region 203 has the N type (N⁺). Therefore, according to the solid-state imaging element 200 in the present example, a photodiode is formed of the substrate 201 and the accumulation regions 2021 to 2024, and the electrons are accumulated in the accumulation regions 2021 to 2024. The accumulation regions 2021 to 2024 are formed by sequentially implanting the N-type impurity to implantation regions 2051 to 2054. In addition, the implantation regions 2051 to 2054 are close to the transfer section 204, respectively, and the implantation regions 2051, 2052, 2053, and 2054 are decreased in size in this order.

According to the solid-state imaging element 200, a concentration (N---) of the N-type impurity in the accumulation region 2021 provided farthest from the transfer section 204 is lowest, a concentration (N--) of the N-type impurity in the accumulation region 2022 provided second farthest is second lowest, a concentration (N-) of the N-type impurity in the accumulation region 2023 provided third farthest is third lowest, and a concentration (N) of the N-type impurity in the accumulation region 2024 provided closest to the transfer section 204 is highest. Therefore, as shown in FIG. 22 (c), the potential in the accumulation regions 2021 to 2024 can be inclined so as to decrease with the decreasing distance to the transfer section 204. Thus, it is possible to accelerate the movement of the electrons in the accumulation regions 2021 to 2024 to the transfer section 204. Therefore, even when the area of the accumulation regions 2021 to 2024 increases, the electrons accumulated in the accumulation regions 2021 to 2024 can be immediately transferred to the read-out region 203.

PRIOR ART DOCUMENT

Patent Document

Patent Document 1: JP 2000-236081 A

SUMMARY OF THE INVENTION

Problems to be Solved by the Invention

However, as shown in FIGS. 22 (a) and (b), according to the solid-state imaging element 200 disclosed in Patent Document 1, in order to form the accumulation regions 2021 to 2024 each having the different N-type impurity concentration, it is necessary to sequentially implant the N-type impurity to each of the implantation regions 2051 to 2054 with implantation conditions (such as a doze amount or implantation energy) different from each other. Furthermore, positioning needs to be performed each time the N-type impurity is implanted to each of the implantation regions 2051 to 2054. This positioning is to be performed with a very high degree of accuracy; otherwise there is a large variation in characteristics of the manufactured solid-state imaging element 200. Therefore, the solid-state imaging element 200 disclosed in Patent Document 1 has the problem that the manufacturing process is complicated and requires a high degree of accuracy.

In the solid-state imaging element 200 manufactured by implanting the N-type impurity several times, the concentrations of the N-type impurity in the accumulation regions 2021 to 2024 are inevitably controlled step by step, so that the potential in the accumulation regions 2021 to 2024 take a step-like shape (refer to FIG. 22 (c)). However, with the potential having this step-like shape, the movement of the electrons cannot be controlled with a high degree of accuracy, which is the problem.

Thus, an object of the present invention is to provide a solid-state imaging element which can be simply manufactured and which can control movement of electric charges in an accumulation region with a high degree of accuracy, and a method of manufacturing the same.

Means for Solving the Problem

To achieve the above object, the present invention provides a solid-state imaging element comprising: a substrate having a first conductivity type; an accumulation region having a second conductivity type opposite to the first conductivity type and provided in the substrate, for accumulating electric charges generated by a photoelectric conversion; a read-out region having the second conductivity type and provided in the substrate, for receiving the transferred electric charges accumulated in the accumulation region; and a transfer section formed above a region between the accumulation region and the read-out region in the substrate and provided for transferring the electric charges from the accumulation region to the read-out region, wherein an impurity concentration modulation region having a locally high concentration of an impurity having the second conductivity type, or having a locally low concentration of an impurity having the first conductivity type is formed in a part of the accumulation region, and an area of the impurity concentration modulation region per unit distance with respect to the transfer section, or a density of the discretely provided impurity concentration modulation regions increases with decreasing distance to the transfer section.

According to this solid-state imaging element, the potential in the accumulation region can be inclined so as to accelerate the movement of the electric charges accumulated in the accumulation region to the transfer section. Especially, the potential can be inclined only by adjusting the area per unit distance with respect to the transfer section or the density of the impurity concentration modulation regions (the implantation regions of the impurity having the first conductivity type or the second conductivity type in the accumulation region) formed in the accumulation region.

In addition, "the first conductivity type" and "the second conductivity type" are the P type and the N type. For example, when "the first conductivity type" is the P type, "the second conductivity type" is the N type. Meanwhile, when "the first conductivity type" is the N type, "the second conductivity type" is the P type. In addition, "the substrate having the first conductivity type" means that a section where an element structure in the substrate is formed has the first conductivity type, so that it includes not only a substrate having the first conductivity type as a whole, but also a substrate including a well having the first conductivity type (such as a substrate in which a well having the first conductivity type is formed by implanting an impurity having the first conductivity type into a substrate having the second conductivity type as a whole).

In addition, in the solid-state imaging element, preferably a width of the impurity concentration modulation region increases with the decreasing distance to the transfer section.

According to this solid-state imaging element, the area of the impurity concentration modulation region per unit distance with respect to the transfer section increases with the decreasing distance to the transfer section. Therefore, the potential in the accumulation region can be inclined so as to accelerate the movement of the electric charges accumulated in the accumulation region to the transfer section.

In addition, in the solid-state imaging element, preferably a width of the impurity concentration modulation region continuously increases with the decreasing distance to the transfer section. For example, preferably a width of the impurity concentration modulation region linearly or exponentially increases with the decreasing distance to the transfer section.

According to the solid-state imaging element, the potential in the accumulation region can be smoothly inclined. Therefore, the electric charges accumulated in the accumulation region can be smoothly moved to the transfer section.

In the solid-state imaging element, preferably a width of the impurity concentration modulation region discretely increases with the decreasing distance to the transfer section.

In addition, in the solid-state imaging element, preferably, the impurity concentration modulation region branches into two or more parts in a direction being away from the transfer section.

According to this solid-state imaging element, the potential can be inclined in a large range of the accumulation region. Therefore, it becomes possible to effectively accelerate the movement of the electric charges accumulated in the accumulation region to the transfer section.

In addition, in the solid-state imaging element, preferably, a plurality of the impurity concentration modulation regions extend in parallel to the direction being away from the transfer section.

According to this solid-state imaging element, the area (total area) per unit distance with respect to the transfer section or the density of the plurality of the impurity concentration modulation regions increases as a whole, so that the potential in the accumulation region can be inclined so as to accelerate the movement of the electric charges accumulated in the accumulation region to the transfer section.

In addition, in the solid-state imaging element, preferably, an interval between the adjacent impurity concentration modulation regions becomes narrow with the decreasing distance to a center of the transfer section among the impurity concentration modulation regions.

According to this solid-state imaging element, the density of the impurity concentration modulation regions increases with the decreasing distance to the transfer section. Therefore, the potential in the accumulation region can be inclined so as to accelerate the movement of the electric charges accumulated in the accumulation region to the transfer section.

In addition, in the solid-state imaging element, preferably, a plurality of the impurity concentration modulation regions radially extend in the direction being away from the transfer section.

According to this solid-state imaging element, the density of the impurity concentration modulation regions increases with the decreasing distance to the transfer section. Therefore, the potential in the accumulation region can be inclined so as to accelerate the movement of the electric charges accumulated in the accumulation region to the transfer section.

In addition, in the solid-state imaging element, preferably, a width of an outline region surrounded by an outline enclosing the plurality of the impurity concentration modulation regions increases with the decreasing distance to the transfer section.

According to this solid-state imaging element, the area (total area) of the plurality of the impurity concentration modulation regions per unit distance with respect to the transfer section increases as a whole with the decreasing distance to the transfer section. Therefore, the potential in the accumulation region can be inclined so as to accelerate the movement of the electric charges accumulated in the accumulation region to the transfer section.

In addition, in the solid-state imaging element, preferably, the width of the outline region continuously increases with the decreasing distance to the transfer section. For example, preferably, the width of the outline region linearly or exponentially increases with the decreasing distance to the transfer section.

According to the solid-state imaging element, the potential in the accumulation region can be smoothly inclined. Therefore, the electric charges accumulated in the accumulation region can be smoothly moved to the transfer section.

In addition, in the solid-state imaging element, preferably, the width of the outline region discretely increases with the decreasing distance to the transfer section.

In addition, in the solid-state imaging element, preferably, the outline region branches into two or more parts in a direction being away from the transfer section.

According to this solid-state imaging element, the potential can be inclined in a large range of the accumulation region. Therefore, it becomes possible to effectively accelerate the movement of the electric charges accumulated in the accumulation region to the transfer section.

In addition, in the solid-state imaging element, preferably, in the case where the concentration of the impurity having the second conductivity type is locally high in the impurity concentration modulation region, the concentration of the impurity having the second conductivity type is uniform in the impurity concentration modulation region, and in the case where the concentration of the impurity having the first conductivity type is locally low in the impurity concentration modulation region, the concentration of the impurity having the first conductivity type is uniform in the accumulation region other than the impurity concentration modulation region.

According to this solid-state imaging element, the whole impurity concentration modulation region can be formed by implanting the impurity having the first conductivity type or the impurity having the second conductivity type at one time. Therefore, the impurity concentration modulation region can be simply formed.

The present invention provides a method of manufacturing a solid-state imaging element comprising: a substrate having a first conductivity type; an accumulation region having a second conductivity type opposite to the first conductivity type and provided in the substrate, for accumulating electric charges generated by a photoelectric conversion; a read-out region having the second conductivity type and provided in the substrate, for receiving the transferred electric charges accumulated in the accumulation region; and a transfer section formed above a region between the accumulation region and the read-out region in the substrate and provided for transferring the electric charges from the accumulation region to the read-out region, wherein an impurity concentration modulation region having a locally high concentration of an impurity having the second conductivity type, or having a locally low concentration of an impurity having the first conductivity type is formed, by selectively implanting the impurity having the first conductivity type or the impurity having the second conductivity type, in a part of the accumulation region and an area of the impurity concentration modulation region per unit distance with respect to the transfer section, or a density of the discretely provided impurity concentration modulation regions increases with the decreasing distance to the transfer section.

According to the method of manufacturing this solid-state imaging element, the potential in the accumulation region can be inclined so as to accelerate the movement of the electric charges accumulated in the accumulation region to the transfer section. Especially, the potential can be inclined only by adjusting the area per unit distance with respect to the transfer section or the density of the implantation regions of the impurity having the first conductivity type or the impurity having the second conductivity type in the accumulation region (the impurity concentration modulation regions formed in the accumulation region).

Effect of the Invention

According to the solid-state imaging element and the method of manufacturing the same having the above characteristics, it becomes possible to incline the potential in the accumulation region, and accelerate the movement of the electric charges accumulated in the accumulation region to the transfer section only by adjusting the area per unit distance with respect to the transfer section or the density of the impurity concentration modulation regions formed in the accumulation region (the implantation region of the impurity having the first conductivity type or the second conductivity type in the accumulation region). Therefore, this solid-state imaging element can be simply manufactured.

Furthermore, it is possible to steplessly adjust the area per unit distance with respect to the transfer section or the density of the impurity concentration modulation regions formed in the accumulation region (the implantation regions of the impurity having the first conductivity type or the second conductivity type in the accumulation region). Therefore, according to the solid-state imaging element and the method of manufacturing the same having the above characteristics, the potential in the accumulation region can be inclined in a desired manner, and the movement of the electric charges in the accumulation region can be controlled with a high degree of accuracy.

BRIEF DESCRIPTION OF THE DRAWINGS

FIG. 22 is a view showing a conventional solid-state imaging element.

DESCRIPTION OF EMBODIMENT

Hereinafter, a solid-state imaging element according to each embodiment of the present invention will be described with reference to the drawings. In addition, the description will be given to a case where the solid-state imaging element according to each embodiment of the present invention is a CMOS imaging sensor in which an N-type accumulation region is formed in a p-type substrate, in order to embody the following description.

In addition, "P-type substrate" means a substrate in which a section where an element structure is formed has a P type, so that the P-type substrate is not limited to a substrate which has the P type as a whole, but includes a substrate having a P-type well (such as a substrate in which a P-type well is formed by implanting a P-type impurity into a substrate having an N type as a whole), as a matter of course. Here, it is to be noted that each view referred in the following description shows the substrate having the P type as a whole.

Furthermore, the substrate may be composed of material such as silicon. In this case, as the P-type impurity, boron may be used. In this case, as an N-type impurity, phosphor or zinc may be used. Furthermore, these impurities can be implanted into the substrate by a method such as ion implantation.

<<Basic Principle>>

Figure 1:
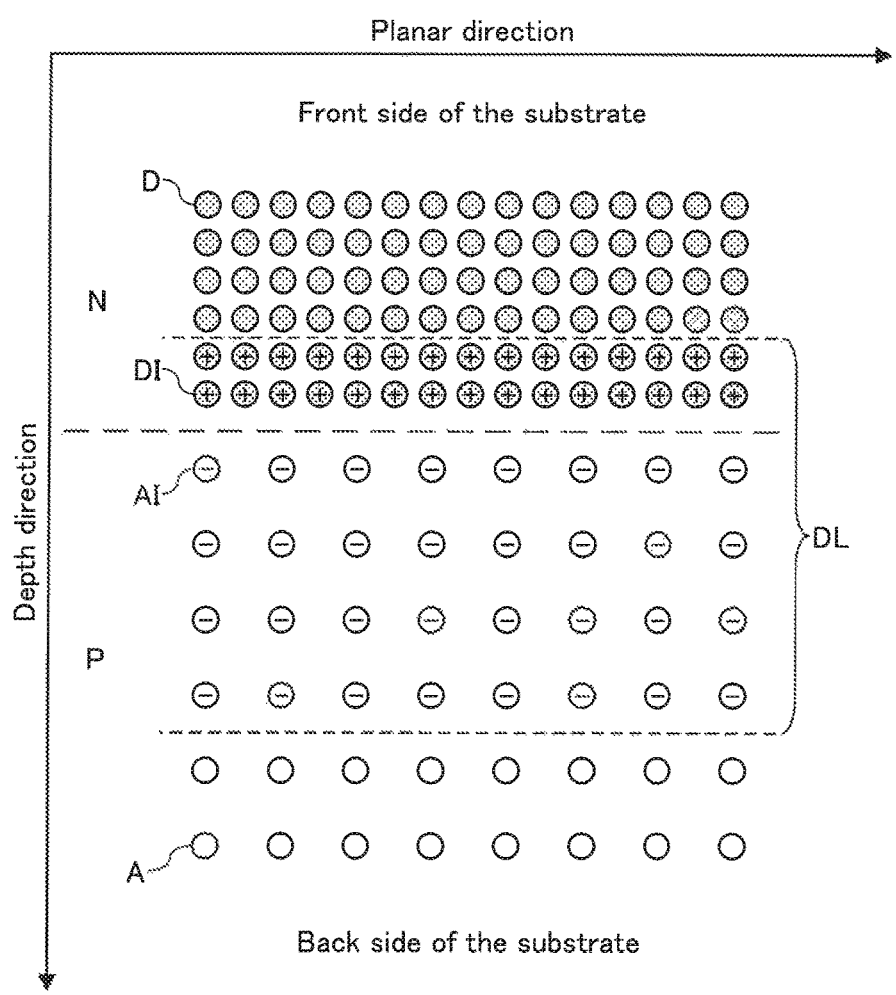
FIG. 1 is a schematic view showing a state in which an N-type impurity is implanted into a whole surface of a P-type substrate.

Prior to the description for the solid-state imaging element according to each embodiment of the present invention, a basic principle of the solid-state imaging element according to each embodiment of the present invention will be described with reference to FIGS. 1 and 2. FIG. 1 is a schematic view showing a state in which the N-type impurity is implanted into a whole surface of the P-type substrate. In addition, FIG. 2 is a schematic view showing a state in which the N-type impurity is implanted into one part of the surface of the P-type substrate.

Figure 2:
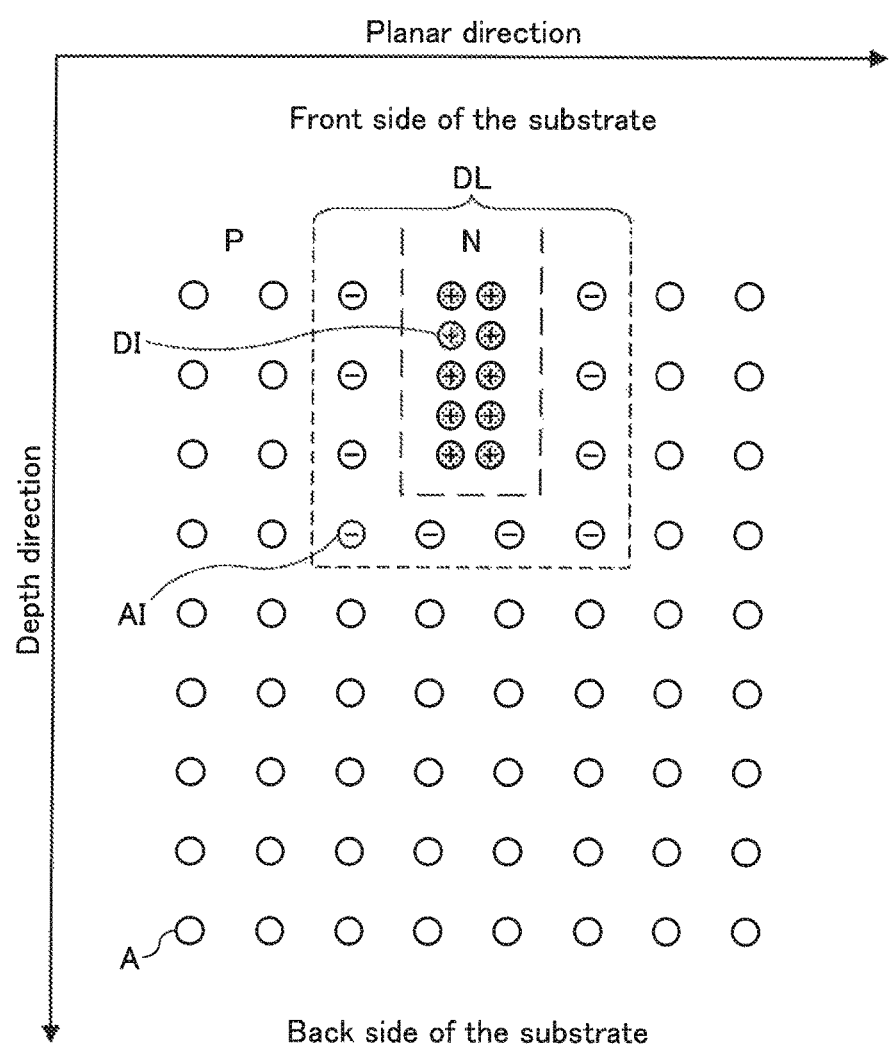
FIG. 2 is a schematic view showing a state in which an N-type impurity is implanted to a part of a surface of a P-type substrate.

As shown in FIGS. 1 and 2, when donors D serving as the N-type impurity are implanted into the P-type substrate having acceptors A, a depletion layer DL is formed of ionized acceptors AI and ionized donors DI, in the vicinity of a boundary of a region having diffused donors D.

Figure 21:
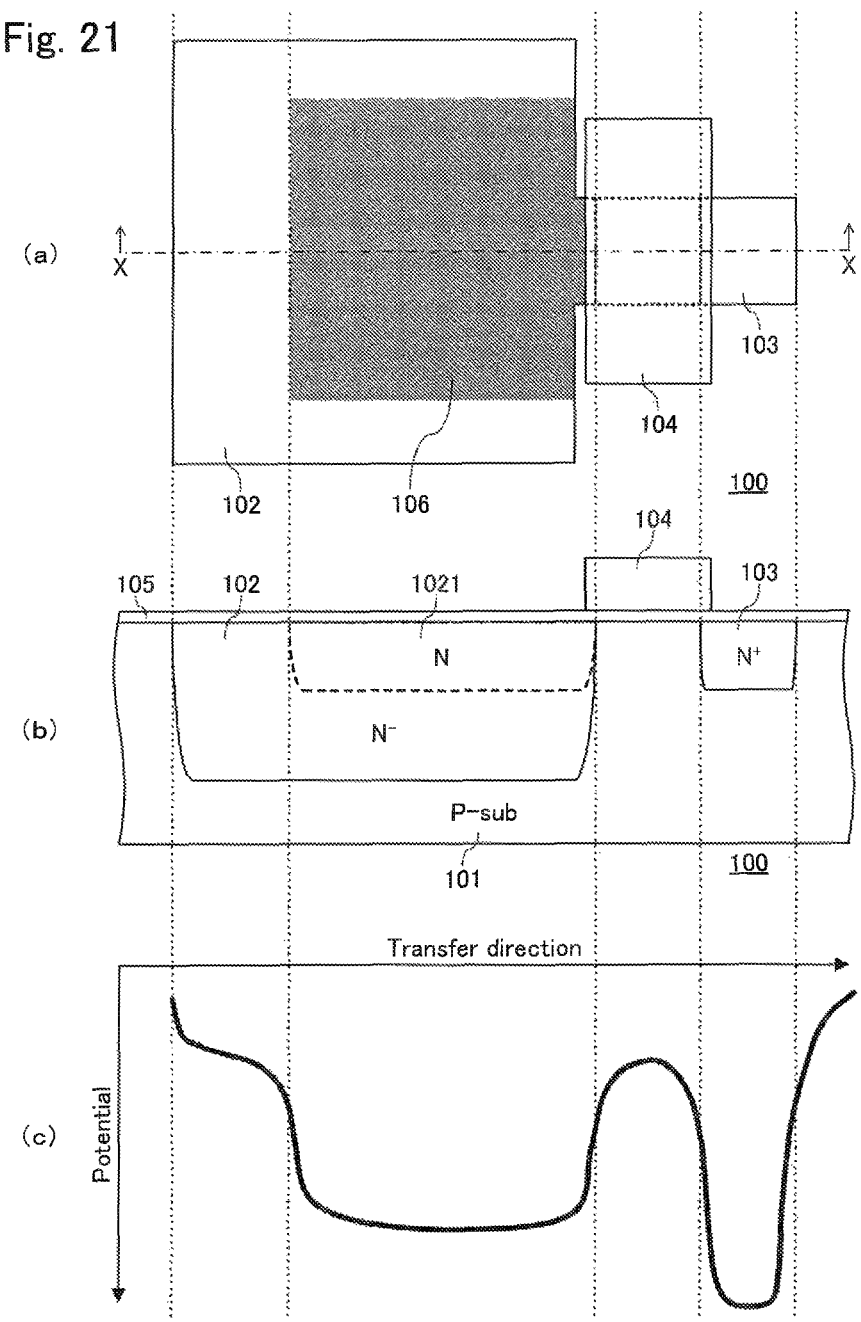
FIG. 21 is a view showing a conventional solid-state imaging element.

Here, when the donors D are implanted into the whole surface of the substrate as shown in FIG. 1, the depletion layer DL spreads in a depth direction of the substrate (in a direction vertical to the surface of the substrate), and has a shape of a thin plate parallel to the planar direction (the direction parallel to the surface of the substrate). In addition, a thickness of the depletion layer DL and a position of the depletion layer DL in the depth direction are the same in the whole surface of the substrate. Therefore, in the case where the depletion layer DL shown in FIG. 1 is formed, a flat potential is formed as shown in FIG. 21 (c).

Meanwhile, as shown in FIG. 2, when the donors D are implanted into the one part of the surface of the substrate restrictively, the depletion layer DL spreads in the planar direction as well as in the depth direction. Thus, when the region having the donors D is made larger compared with the state shown in FIG. 2, the depletion layer DL spreads deeper in the depth direction, and its state comes close to the state shown in FIG. 1. That is, by enlarging the region having the donors D, the depletion layer DL can be formed deeper, so that the potential can be lowered.

As for the solid-state imaging element according to each embodiment of the present invention, by using the fact that the potential is gradually lowered as the region having the donors D is gradually enlarged, an accumulation region is formed such that the potential is inclined so as to be lowered toward a transfer section, so that it becomes possible to accelerate movement of electrons accumulated in the accumulation region to the transfer section.

In addition, FIGS. 1 and 2 exemplify the case where the N-type impurity is directly implanted into the P-type substrate to simplify the description, but even in the case where the N-type impurity is further implanted into an N-type region formed in the P-type substrate, the potential can be inclined based on the similar principle (first embodiment of the present invention which will be described below). On the other hand, even in the case where the P-type impurity is implanted into the N-type region formed in the P-type substrate, the potential can be inclined based on the same principle (second embodiment of the present invention which will be described below).

<<First Embodiment>>

<First Example>

Figure 3:
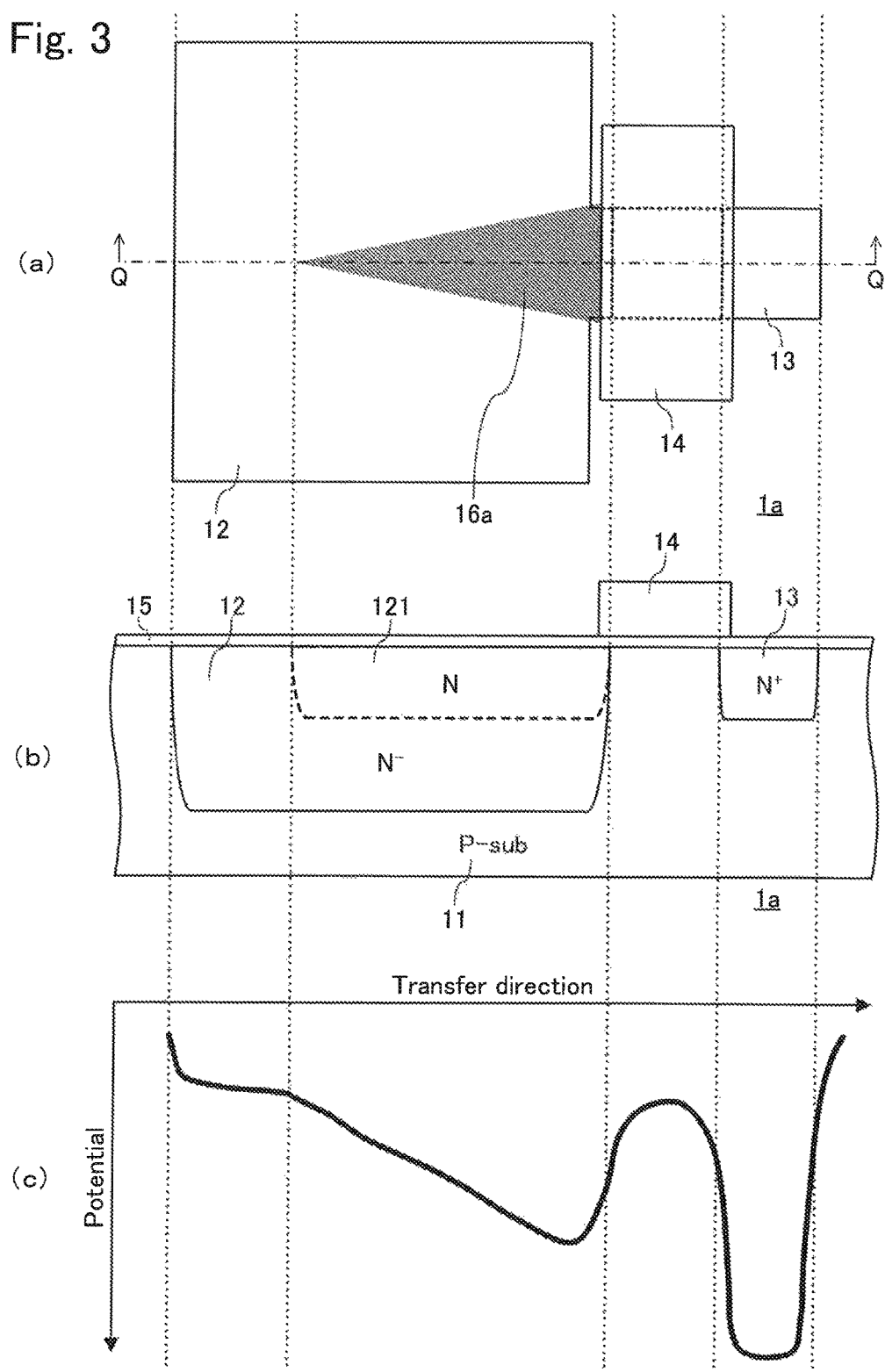
FIG. 3 is a view showing a first example of a solid-state imaging element according to a first embodiment of the present invention.

Hereinafter, solid-state imaging elements according to a first embodiment of the present invention will be described with reference to the drawings. First, a first example of the solid-state imaging element according to the first embodiment of the present invention will be described with reference to FIG. 3. FIG. 3 is a view showing the first example of the solid-state imaging element according to the first embodiment of the present invention. In addition, FIG. 3 (a) is a plan view of one pixel in the solid-state imaging element, FIG. 3 (b) is a cross-sectional view showing a cross-sectional surface taken along Q-Q in FIG. 3 (a). Furthermore, FIG. 3 (c) is a graph showing a potential in the cross-sectional surface taken along Q-Q in FIG. 3 (a).

As shown in FIGS. 3 (a) and (b), a solid-state imaging element 1a includes a substrate 11, an accumulation region 12 formed in the substrate 11, for accumulating electrons generated in the substrate 11 by a photoelectric conversion, a read-out region 13 formed in the substrate 11, for receiving the transferred electrons accumulated in the accumulation region 12, a transfer section 14 for transferring the electrons from the accumulation region 12 to the read-out region 13, and an insulating film 15 formed on a surface of the substrate 11. The transfer section 14 serves as a gate electrode formed on the insulating film 15 and is formed between the accumulation region 12 and the read-out region 13.

The substrate 11 has the P type (P-sub), the accumulation region 12 has the N type (N$^-$), and the read-out region 13 has the N type (N$^+$). In the solid-state imaging element 1a, an N-type impurity is separately implanted into an implantation region 16a formed adjacent to the transfer section 14 in the accumulation region 12, whereby an N-type high-concentration impurity region 121 (impurity concentration modulation region) having the N type (N) is formed. Therefore, according to the solid-state imaging element 1a in the present example, a photodiode is composed of the substrate 11 and the accumulation region 12, and the electrons are accumulated in the accumulation region 12.

As shown in FIG. 3 (a), according to the solid-state imaging element 1a in the present example, the implantation region 16a has a shape in which its width continuously and linearly increases with decreasing distance to the transfer section 14. The N-type high-concentration impurity region 121 has the same shape as the implantation region 16a.

Thus, when the accumulation region 12 is formed so as to have this N-type high-concentration impurity region 121, the potential in the accumulation region 12 can be inclined so as to be lowered with the decreasing distance to the transfer section 14, as shown in FIG. 3 (c). Therefore, it becomes possible to accelerate the movement of the electrons accumulated in the accumulation region 12 to the transfer section 14.

Furthermore, according to the solid-state imaging element 1a in the present example, the potential in the accumulation region 12 can be smoothly inclined. Therefore, the electrons accumulated in the accumulation region 12 can be smoothly moved to the transfer section 14.

When a predetermined potential is applied to the transfer section 14 in the solid-state imaging element 1a, the potential in the substrate 11 just below the transfer section 14 is lowered, and the electrons accumulated in the accumulation region 12 are transferred to the read-out region 13. At this time, since the potential in the accumulation region 12 is inclined as described above, the movement of the electrons accumulated in the accumulation region 12 to the transfer section 14 is accelerated. Therefore, even when the accumulation region 12 is large in size in the solid-state imaging element 1a, the electrons accumulated in the accumulation region 12 can be immediately transferred to the read-out region 13 (within a predetermined read-out period), so that a residual image can be prevented from being generated in an obtained image.

<Second Example>

Figure 4:
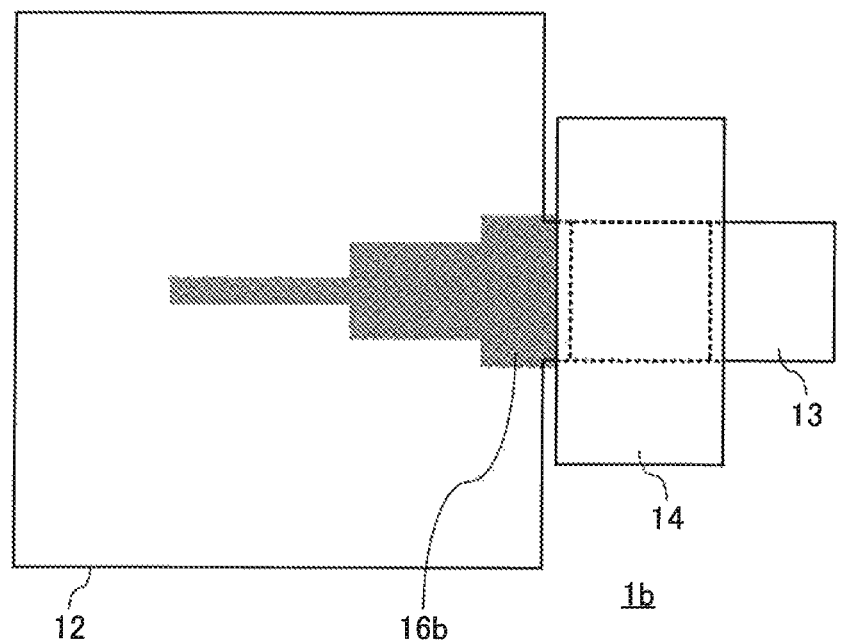
FIG. 4 is a view showing a second example of a solid-state imaging element according to the first embodiment of the present invention.

Next, a second example of the solid-state imaging element according to the first embodiment of the present invention will be described with reference to FIG. 4. FIG. 4 is a view showing the second example of the solid-state imaging element according to the first embodiment of the present invention. In addition, FIG. 4 corresponds to FIG. 3 (a) showing the first example of the solid-state imaging element according to the first embodiment of the present invention. Furthermore, the present example differs from the first example only in an implantation region, and they are the same other than that. Therefore, hereinafter, only an implantation region 16b in the present example will be described, and as for the rest of it, the description in the first example of the first embodiment described above and FIG. 3 is to be occasionally used as references, and its description is omitted.

As shown in FIG. 4, according to a solid-state imaging element 1b in the present example, the implantation region 16b has a shape in which its width discretely increases with the decreasing distance to the transfer section 14. In addition, the N-type high-concentration impurity region 121 has the same shape as the implantation region 16b.

Thus, when the accumulation region 12 is formed so as to have the above N-type high-concentration impurity region 121, the potential in the accumulation region 12 can be inclined so as to be lowered with the decreasing distance to the transfer section 14. Therefore, it becomes possible to accelerate the movement of the electrons accumulated in the accumulation region 12 to the transfer section 14.

<Third Example>

Figure 5:
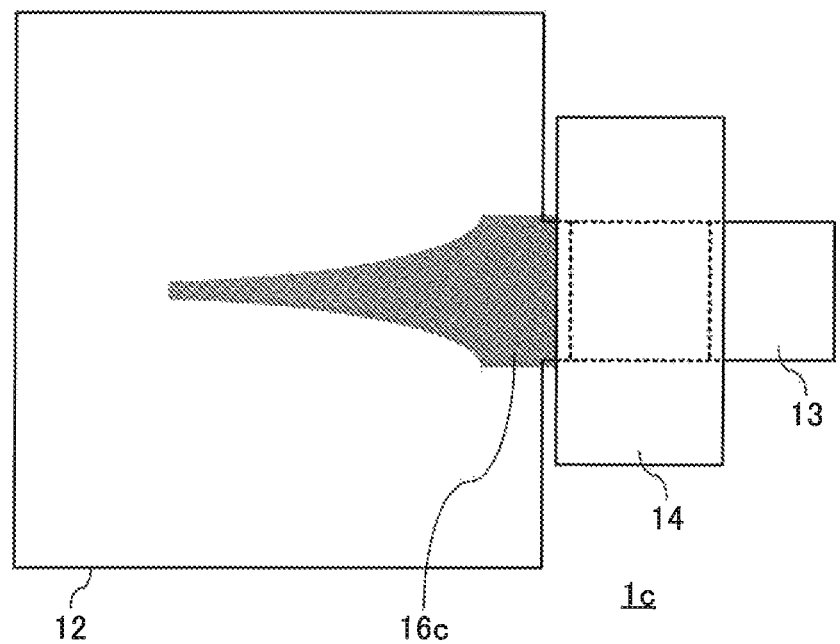
FIG. 5 is a view showing a third example of a solid-state imaging element according to the first embodiment of the present invention.

Next, a third example of the solid-state imaging element according to the first embodiment of the present invention will be described with reference to FIG. 5. FIG. 5 is a view showing the third example of the solid-state imaging element according to the first embodiment of the present invention. In addition, FIG. 5 corresponds to FIG. 3 showing the first example of the solid-state imaging element according to the first embodiment of the present invention. Furthermore, the present example differs from the first example only in an implantation region, and the present and the first examples are the same other than that. Therefore, hereinafter, only an implantation region 16c in the present example will be described, and for the rest of it, the description in the first example of the first embodiment described above and FIG. 3 is to be occasionally used as a reference, and its description is omitted.

As shown in FIG. 5, according to a solid-state imaging element 1c in the present example, the implantation region 16c has a shape in which its width continuously and exponentially increases with the decreasing distance to the transfer section 14. In addition, the N-type high-concentration impurity region 121 has the same shape as the implantation region 16c.

Thus, when the accumulation region 12 is formed so as to have the above N-type high-concentration impurity region 121, the potential in the accumulation region 12 can be inclined so as to be lowered with the decreasing distance to the transfer section 14. Therefore, it becomes possible to accelerate the movement of the electrons accumulated in the accumulation region 12 to the transfer section 14.

Furthermore, according to the solid-state imaging element 1c in the present example, the potential in the accumulation region 12 can be smoothly inclined. Therefore, the electrons accumulated in the accumulation region 12 can be smoothly moved to the transfer section 14.

<Fourth Example>

Figure 6:
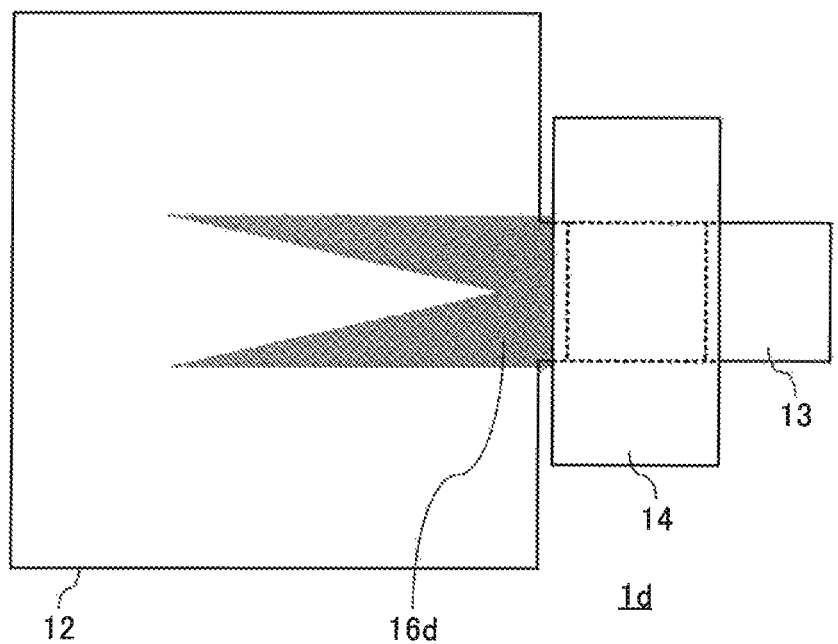
FIG. 6 is a view showing a fourth example of a solid-state imaging element according to the first embodiment of the present invention.

Next, a fourth example of the solid-state imaging element according to the first embodiment of the present invention will be described with reference to FIG. 6. FIG. 6 is a view showing the fourth example of the solid-state imaging element according to the first embodiment of the present invention. In addition, FIG. 6 corresponds to FIG. 3 (a) showing the first example of the solid-state imaging element according to the first embodiment of the present invention. Furthermore, the present example differs from the first example only in an implantation region, and the present and the first examples are the same other than that. Therefore, hereinafter, only an implantation region 16d in the present example will be described, and as for the rest of it, the description in the first example of the first embodiment described above and FIG. 3 is to be occasionally used as references, and its description is omitted.

As shown in FIG. 6, according to a solid-state imaging element 1d in the present example, the implantation region 16d has a shape in which the implantation region 16d branches into two parts in a direction being away from the transfer section 14 and a width of each branch continuously and lineally increases with the decreasing distance to the transfer section 14. In addition, the N-type high-concentration impurity region 121 has the same shape as the implantation region 16d.

Thus, when the accumulation region 12 is formed so as to have the above N-type high-concentration impurity region 121, the potential in the accumulation region 12 can be inclined so as to be lowered with the decreasing distance to the transfer section 14. Therefore, it becomes possible to accelerate the movement of the electrons accumulated in the accumulation region 12 to the transfer section 14.

Furthermore, according to the solid-state imaging element 1d in the present example, the potential in the accumulation region 12 can be smoothly inclined. Therefore, the electrons accumulated in the accumulation region 12 can be smoothly moved to the transfer section 14. Furthermore, according to the solid-state imaging element 1d in the present example, the potential can be inclined in a large range of the accumulation region 12. Therefore, it becomes possible to effectively accelerate the movement of the electrons accumulated in the accumulation region 12 to the transfer section 14.

<Fifth Example>

Figure 7:
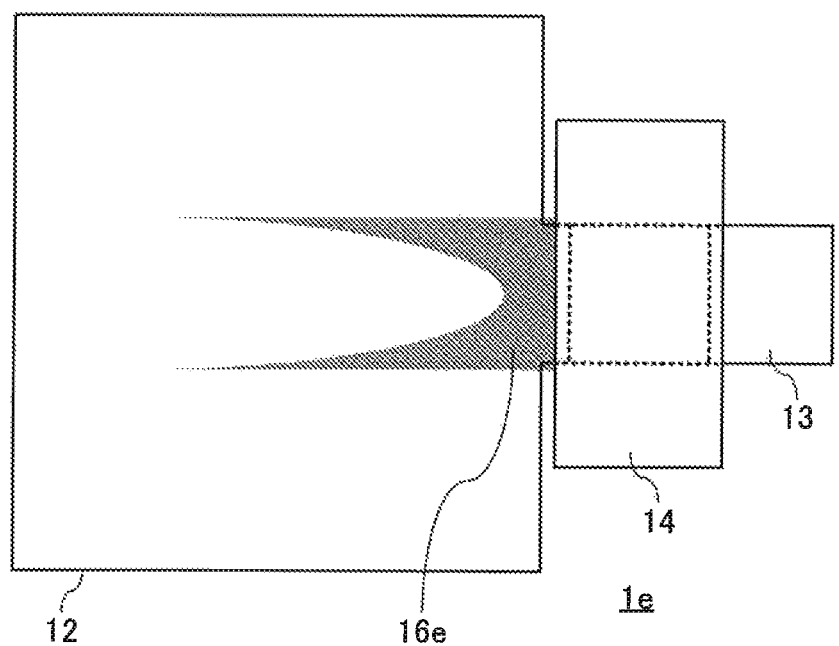
FIG. 7 is a view showing a fifth example of a solid-state imaging element according to the first embodiment of the present invention.

Next, a fifth example of the solid-state imaging element according to the first embodiment of the present invention will be described with reference to FIG. 7. FIG. 7 is a view showing the fifth example of the solid-state imaging element according to the first embodiment of the present invention. In addition, FIG. 7 corresponds to FIG. 3 (a) showing the first example of the solid-state imaging element according to the first embodiment of the present invention. Furthermore, the present example differs from the first example only in an implantation region, and the present and the first examples are the same other than that. Therefore, hereinafter, only an implantation region 16e in the present example will be described, and as for the rest of it, the description in the first example of the first embodiment described above and FIG. 3 is to be occasionally used as references, and its description is omitted.

As shown in FIG. 7, according to a solid-state imaging element 1e in the present example, the implantation region 16e has a shape in which the implantation region 16e branches into two parts in the direction being away from the transfer section 14 and a width of each branch continuously and exponentially increases with the decreasing distance to the transfer section 14. In addition, the N-type high-concentration impurity region 121 has the same shape as the implantation region 16e.

Thus, when the accumulation region 12 is formed so as to have the above N-type high-concentration impurity region 121, the potential in the accumulation region 12 can be inclined so as to be lowered with the decreasing distance to the transfer section 14. Therefore, it becomes possible to accelerate the movement of the electrons accumulated in the accumulation region 12 to the transfer section 14.

Furthermore, according to the solid-state imaging element 1e in the present example, the potential in the accumulation region 12 can be smoothly inclined. Therefore, the electrons accumulated in the accumulation region 12 can be smoothly moved to the transfer section 14. Furthermore, according to the solid-state imaging element 1e in the present example, the potential can be inclined in a large range of the accumulation region 12. Therefore, it becomes possible to effectively accelerate the movement of the electrons accumulated in the accumulation region 12 to the transfer section 14.

<Sixth Example>

Figure 8:
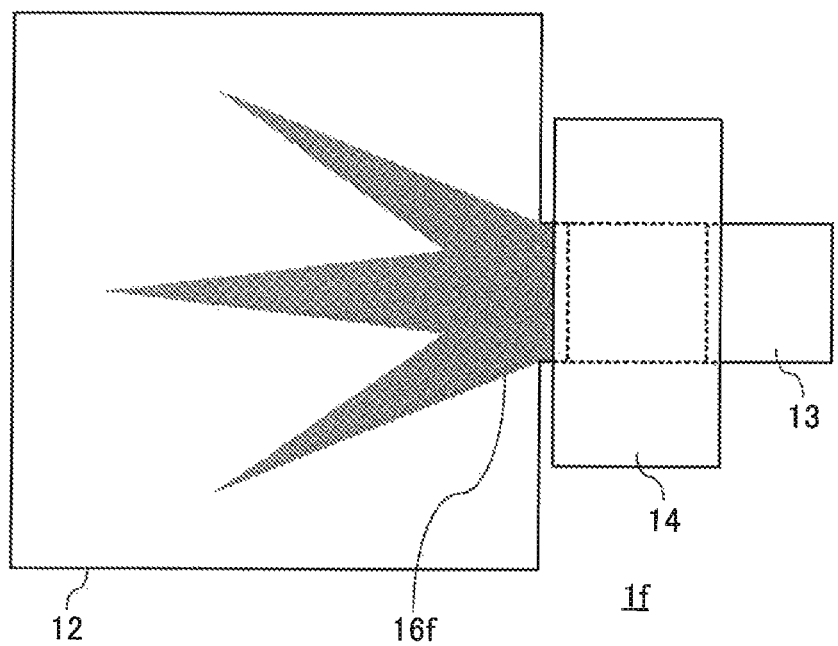
FIG. 8 is a view showing a sixth example of a solid-state imaging element according to the first embodiment of the present invention.

Next, a sixth example of the solid-state imaging element according to the first embodiment of the present invention will be described with reference to FIG. 8. FIG. 8 is a view showing the sixth example of the solid-state imaging element according to the first embodiment of the present invention. In addition, FIG. 8 corresponds to FIG. 3 (a) showing the first example of the solid-state imaging element according to the first embodiment of the present invention. Furthermore, the present example differs from the first example only in an implantation region, and the present and the first examples are the same other than that. Therefore, hereinafter, only an implantation region 16f in the present example will be described, and as for the rest of it, the description in the first example of the first embodiment described above and FIG. 3 is to be occasionally used as a reference, and its description is omitted.

As shown in FIG. 8, according to a solid-state imaging element 1f in the present example, the implantation region 16f has a shape in which the implantation region 16f branches into three parts in the direction being away from the transfer section 14 and a width of each branch continuously and lineally increases with the decreasing distance to the transfer section 14. In addition, the N-type high-concentration impurity region 121 has the same shape as the implantation region 16f.

Thus, when the accumulation region 12 is formed so as to have the above N-type high-concentration impurity region 121, the potential in the accumulation region 12 can be inclined so as to be lowered with the decreasing distance to the transfer section 14. Therefore, it becomes possible to accelerate the movement of the electrons accumulated in the accumulation region 12 to the transfer section 14.

Furthermore, according to the solid-state imaging element 1f in the present example, the potential in the accumulation region 12 can be smoothly inclined. Therefore, the electrons accumulated in the accumulation region 12 can be smoothly moved to the transfer section 14. Furthermore, according to the solid-state imaging element 1f in the present example, the potential can be inclined in a large range of the accumulation region 12. Therefore, it becomes possible to effectively accelerate the movement of the electrons accumulated in the accumulation region 12 to the transfer section 14.

<Seventh Example>

Figure 9:
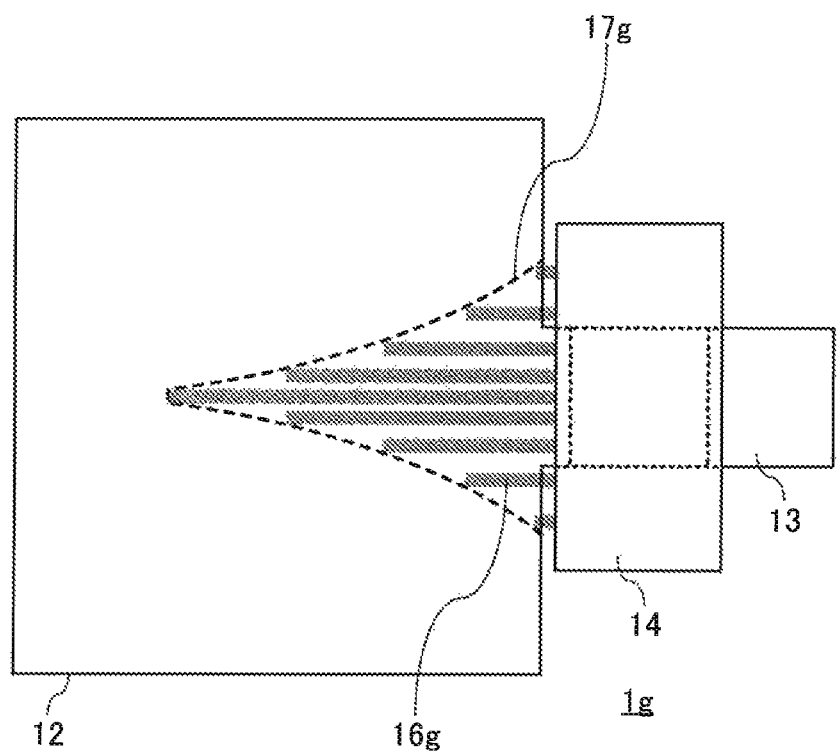
FIG. 9 is a view showing a seventh example of a solid-state imaging element according to the first embodiment of the present invention.

Next, a seventh example of the solid-state imaging element according to the first embodiment of the present invention will be described with reference to FIG. 9. FIG. 9 is a view showing the seventh example of the solid-state imaging element according to the first embodiment of the present invention. In addition, FIG. 9 corresponds to FIG. 3 (a) showing the first example of the solid-state imaging element according to the first embodiment of the present invention. Furthermore, the present example differs from the first example only in an implantation region, and the present and the first examples are the same other than that. Therefore, hereinafter, only an implantation region 16g in the present example will be described, and as for the rest of it, the description in the first example of the first embodiment described above and FIG. 3 is to be occasionally used as references, and its description is omitted.

As shown in FIG. 9, according to a solid-state imaging element 1g in the present example, a plurality of the implantation regions 16g have a shape in which bars extend in parallel to the direction being away from the transfer section 14. In addition, as for the plurality of the implantation regions 16g, an interval between the adjacent implantation regions 16g becomes narrow with the decreasing distance to a center of the transfer section 14 among the implantation regions 16g. In addition, the N-type high-concentration impurity region 121 has the same shape as the implantation region 16g. Furthermore, FIG. 9 also shows an outline region 17g surrounded by an outline enclosing a plurality of the N-type high-concentration impurity regions 121 (implantation regions 16g).

According to the solid-state imaging element 1g in the present example, a width of the outline region 17g continuously and exponentially increases with the decreasing distance to the transfer section 14. Thus, an area (total area) of a plurality of the N-type high-concentration impurity regions 121 (implantation regions 16g) per unit distance with respect to the transfer section 14 increases with the decreasing distance to the transfer section 14, as a whole. As a result, the potential in the accumulation region 12 can be inclined so as to accelerate the movement of the electrons accumulated in the accumulation region 12 to the transfer section 14. Therefore, according to the solid-state imaging element 1g in the present example, it becomes possible to accelerate the movement of the electrons accumulated in the accumulation region 12 to the transfer section 14.

Furthermore, according to the solid-state imaging element 1g in the present example, the potential in the accumulation region 12 can be smoothly inclined. Therefore, the electrons accumulated in the accumulation region 12 can be smoothly moved to the transfer section 14.

In addition, according to the solid-state imaging element 1g in the present example, a density of the N-type high-concentration impurity regions 121 increases with the decreasing distance to the transfer section 14. Thus, since the density of the N-type high-concentration impurity regions 121 increases with the decreasing distance to the transfer section 14, the potential in the accumulation region 12 can be inclined so as to accelerate the movement of the electrons accumulated in the accumulation region 12 to the transfer section 14. Therefore, according to the solid-state imaging element 1g in the present example, it becomes possible to accelerate the movement of the electrons accumulated in the accumulation region 12 to the transfer section 14.

<Eighth Example>

Figure 10:
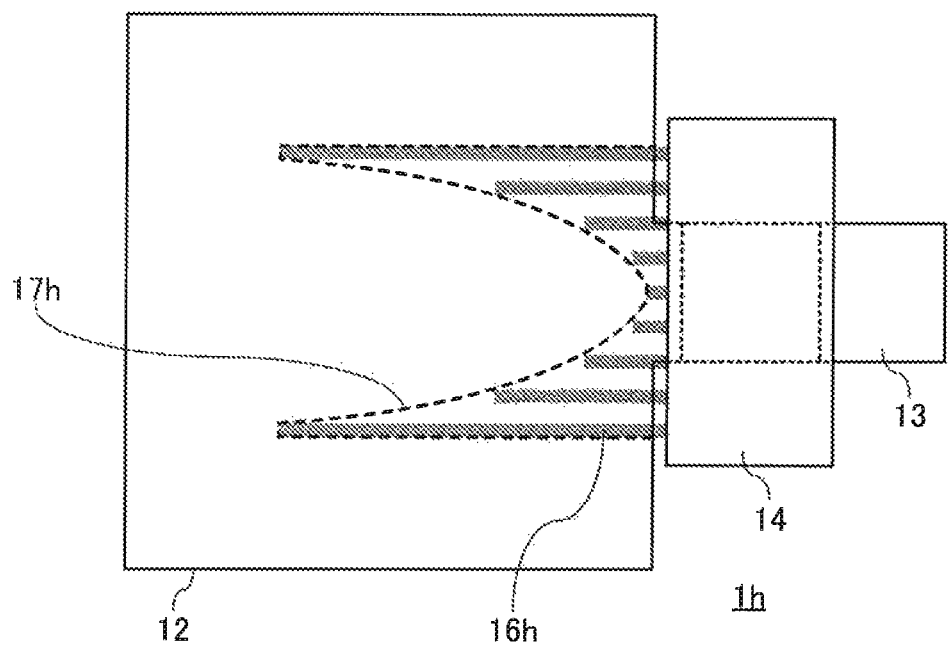
FIG. 10 is a view showing an eighth example of a solid-state imaging element according to the first embodiment of the present invention.

Next, an eighth example of the solid-state imaging element according to the first embodiment of the present invention will be described with reference to FIG. 10. FIG. 10 is a view showing the eighth example of the solid-state imaging element according to the first embodiment of the present invention. In addition, FIG. 10 corresponds to FIG.

3 (*a*) showing the first example of the solid-state imaging element according to the first embodiment of the present invention. Furthermore, the present example differs from the first example only in an implantation region, and the present and the first examples are the same other than that. Therefore, hereinafter, only an implantation region 16*h* in the present example will be described, and as for the rest of it, the description in the first example of the first embodiment described above and FIG. 3 is to be occasionally used as references, and its description is omitted.

As shown in FIG. 10, according to a solid-state imaging element 1*h* in the present example, a plurality of the implantation regions 16*h* have a shape in which bars extend in parallel to the direction being away from the transfer section 14. In addition, an interval between the adjacent implantation regions 16*h* is equal. In addition, the N-type high-concentration impurity region 121 has the same shape as the implantation region 16*h*. Furthermore, FIG. 10 also shows an outline region 17*h* surrounded by an outline enclosing the plurality of the N-type high-concentration impurity regions 121 (implantation regions 16*h*).

According to the solid-state imaging element 1*h* in the present example, the outline region 17*h* branches into two parts in the direction being away from the transfer section 14, and a width of each branch continuously and exponentially increases with the decreasing distance to the transfer section 14. Thus, an area (total area) of the plurality of the N-type high-concentration impurity regions 121 (implantation regions 16*h*) per unit distance with respect to the transfer section 14 increases with the decreasing distance to the transfer section 14, as a whole. As a result, the potential in the accumulation region 12 can be inclined so as to accelerate the movement of the electrons accumulated in the accumulation region 12 to the transfer section 14. Therefore, according to the solid-state imaging element 1*h* in the present example, it becomes possible to accelerate the movement of the electrons accumulated in the accumulation region 12 to the transfer section 14.

Furthermore, according to the solid-state imaging element 1*h* in the present example, the potential in the accumulation region 12 can be smoothly inclined. Therefore, the electrons accumulated in the accumulation region 12 can be smoothly moved to the transfer section 14. In addition, according to the solid-state imaging element 1*h* in the present example, it becomes possible to incline the potential in a large range of the accumulation region 12. Therefore, it becomes possible to effectively accelerate the movement of the electrons accumulated in the accumulation region 12 to the transfer section 14.

<Ninth Example>

Figure 11:
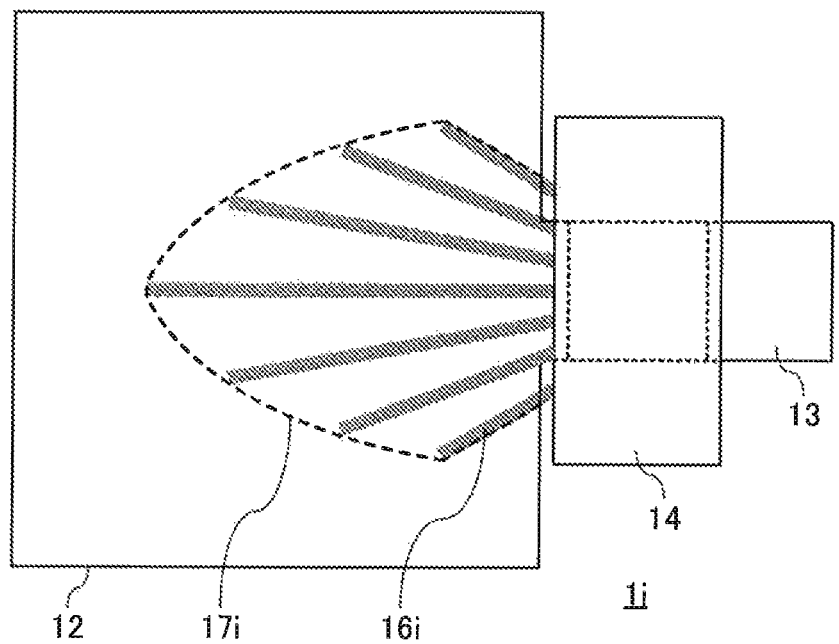
FIG. 11 is a view showing a ninth example of a solid-state imaging element according to the first embodiment of the present invention.

Next, a ninth example of the solid-state imaging element according to the first embodiment of the present invention will be described with reference to FIG. 11. FIG. 11 is a view showing the ninth example of the solid-state imaging element according to the first embodiment of the present invention. In addition, FIG. 11 corresponds to FIG. 3 (*a*) showing the first example of the solid-state imaging element according to the first embodiment of the present invention. Furthermore, the present example differs from the first example only in an implantation region, and the present and the first examples are the same other than that. Therefore, hereinafter, only an implantation region 16*i* in the present example will be described, and as for the rest of it, the description in the first example of the first embodiment described above and FIG. 3 is to be occasionally used as references, and its description is omitted.

As shown in FIG. 11, according to a solid-state imaging element 1*i* in the present example, a plurality of the implantation regions 16*i* have a shape in which bars extend radially in the direction being away from the transfer section 14. In addition, the N-type high-concentration impurity region 121 has the same shape as the implantation region 16*i*. Furthermore, FIG. 11 also shows an outline region 17*i* surrounded by an outline enclosing the plurality of the N-type high-concentration impurity regions 121 (implantation regions 16*i*).

According to the solid-state imaging element 1*i* in the present example, a density of the N-type high-concentration impurity regions 121 increases with the decreasing distance to the transfer section 14. Thus, since the density of the N-type high-concentration impurity regions 121 increases with the decreasing distance to the transfer section 14, the potential in the accumulation region 12 can be inclined so as to accelerate the movement of the electrons accumulated in the accumulation region 12 to the transfer section 14. Therefore, according to the solid-state imaging element 1*i* in the present example, it becomes possible to accelerate the movement of the electrons accumulated in the accumulation region 12 to the transfer section 14.

<Each example of the first embodiment>

As described above, as for the solid-state imaging elements 1*a* to 1*i* according to the first embodiment of the present invention, the area per unit distance with respect to the transfer section 14 or the density of the N-type high-concentration impurity regions 121 formed in the accumulation region 12 (the implantation regions 16*a* to 16*i* of the N-type impurity in the accumulation region 12) is only adjusted so that the area or the density can increase with the decreasing distance to the transfer section 14. As a result, the potential in the accumulation region 12 can be inclined so as to accelerate the movement of the electrons accumulated in the accumulation region 12 to the transfer section 14. Therefore, the solid-state imaging elements 1*a* to 1*i* according to the first embodiment of the present invention can be simply manufactured.

Furthermore, it is possible to steplessly adjust the area per unit distance with respect to the transfer section 14 or the density of the N-type high-concentration impurity regions 121 formed in the accumulation region 12 (the implantation regions 16*a* to 16*i* of the N-type impurity in the accumulation region 12). Therefore, as for the solid-state imaging elements 1*a* to 1*i* according to the first embodiment of the present invention, the potential in the accumulation region 12 can be inclined in a desired manner, and the movement of the electrons in the accumulation region 12 can be controlled with a high degree of accuracy.

In addition, as for the first example to the ninth example (FIGS. 3 to 11), each of the implantation regions 16*a* to 16*i* may be set so as to partially protrude outside the accumulation region 12 (outside an active region or onto an element isolation region, for example).

Furthermore, the description has been given to the case where the implantation regions 16*d* to 16*f* branch into the two or three parts in the fourth example to the sixth example (FIGS. 6 to 8), but each of them may branch into four or more parts. Furthermore, the branched implantation region may have a shape in which its width discretely increases with the decreasing distance to the transfer section 14 (refer to the second example in the first embodiment shown in FIG. 4). In addition, the branched implantation region is not always required to have the same shape, and it may have a different shape.

Furthermore, each of the outline regions 17g to 17i in the seventh example to the ninth example (FIGS. 9 to 11) may employ any shape. For example, each of the outline regions 17g to 17i may have the same shape as the N-type high-concentration impurity region 121 (the implantation regions 16a to 16f) in the first example to the sixth example in the first embodiment (including the above-described variation). Furthermore, the description has been given to the case where each of the N-type high-concentration impurity regions 121 (the implantation regions 16g to 16i) has the bar shape, but it may have a shape other than the bar shape.

<<Second Embodiment>>

<First Example>

Figure 12:
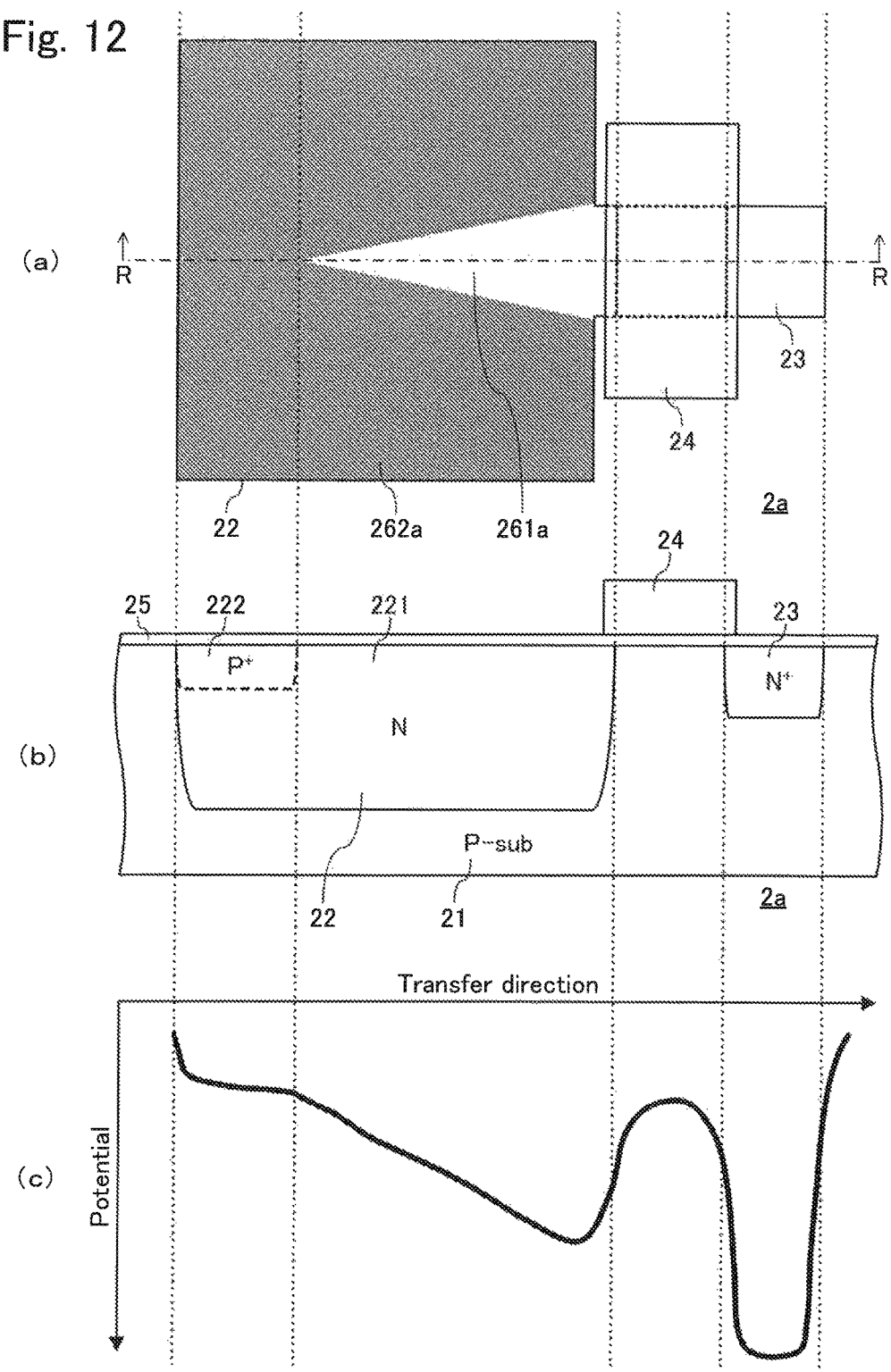
FIG. 12 is view showing a first example of a solid-state imaging element according to a second embodiment of the present invention.

Hereinafter, solid-state imaging elements according to a second embodiment of the present invention will be described with reference to the drawings. First, a first example of the solid-state imaging element according to the second embodiment of the present invention will be described with reference to FIG. 12. FIG. 12 is a view showing the first example of the solid-state imaging element according to the second embodiment of the present invention. In addition, FIG. 12 (a) is a plan view of one pixel in the solid-state imaging element, FIG. 12 (b) is a cross-sectional view showing a cross-sectional surface taken along R-R in FIG. 12 (a). Furthermore, FIG. 12 (c) is a graph showing a potential in the cross-sectional surface taken along R-R in FIG. 12 (a).

As shown in FIG. 12 (a) (b), a solid-state imaging element 2a includes a substrate 21, an accumulation region 22 formed in the substrate 21, for accumulating electrons generated by a photoelectric conversion, a read-out region 23 formed in the substrate 21, for receiving the transferred electrons accumulated in the accumulation region 22, a transfer section 24 for transferring the electrons from the accumulation region 22 to the read-out region 23, and an insulating film 25 formed on a surface of the substrate 21. The transfer section 24 serves as a gate electrode formed on the insulating film 25 and is formed between the accumulation region 22 and the read-out region 23.

The substrate 21 has the P type (P-sub), the accumulation region 22 has the N type (N), and the read-out region 23 has the N type ($N^+$). In addition, according to the solid-state imaging element 2a, a P-type impurity is separately implanted into an implantation region 262a except for a non-implantation region 261a (a region corresponding to the implantation region 16a in the first example of the first embodiment shown in FIG. 3) formed adjacent to the transfer section 24 in the accumulation region 22 so as to form a P-type low-concentration impurity region (an impurity concentration modulation region) 221 having the N type (N) in which the P-type impurity is not implanted, and a P-type high-concentration impurity region 222 having the P type ($P_+$) in which the P-type impurity is implanted. Therefore, according to the solid-state imaging element 2a in the present example, a buried photodiode is formed of the substrate 21 and the accumulation region 22, and electrons are accumulated in the accumulation region 22.

As shown in FIG. 12 (a), according to the solid-state imaging element 2a in the present example, the non-implantation region 261a has a shape in which its width continuously and linearly increases with the decreasing distance to the transfer section 24. In addition, the P-type low-concentration impurity region 221 has the same shape as the non-implantation region 261a. On the other hand, the P-type high-concentration impurity region 222 has the same shape as the implantation region 262a.

Thus, when the accumulation region 22 is formed so as to have this P-type low-concentration impurity region 221, the potential in the accumulation region 22 can be inclined so as to be lowered with the decreasing distance to the transfer section 24 as shown in FIG. 12 (c). Therefore, it becomes possible to accelerate the movement of the electrons accumulated in the accumulation region 22 to the transfer section 24.

Furthermore, according to the solid-state imaging element 2a in the present example, the potential in the accumulation region 22 can be smoothly inclined. Therefore, the electrons accumulated in the accumulation region 22 can be smoothly moved to the transfer section 24.

When a predetermined potential is applied to the transfer section 24 in this solid-state imaging element 2a, a potential in the substrate 21 just below the transfer section 24 is lowered, and the electrons accumulated in the accumulation region 22 are transferred to the read-out region 23. At this time, since the potential in the accumulation region 22 is inclined as described above, the movement of the electrons accumulated in the accumulation region 22 to the transfer section 24 is accelerated. Therefore, even when the accumulation region 22 is large in size in the solid-state imaging element 2a, the electrons accumulated in the accumulation region 22 can be immediately transferred to the read-out region 23 (within a predetermined read-out period), so that a residual image can be prevented from being generated in an obtained image. Furthermore, according to the solid-state imaging element 2a in the present example, the potential in the accumulation region 22 can be inclined at the same time as the buried photodiode is formed.

<Second Example>

Figure 13:
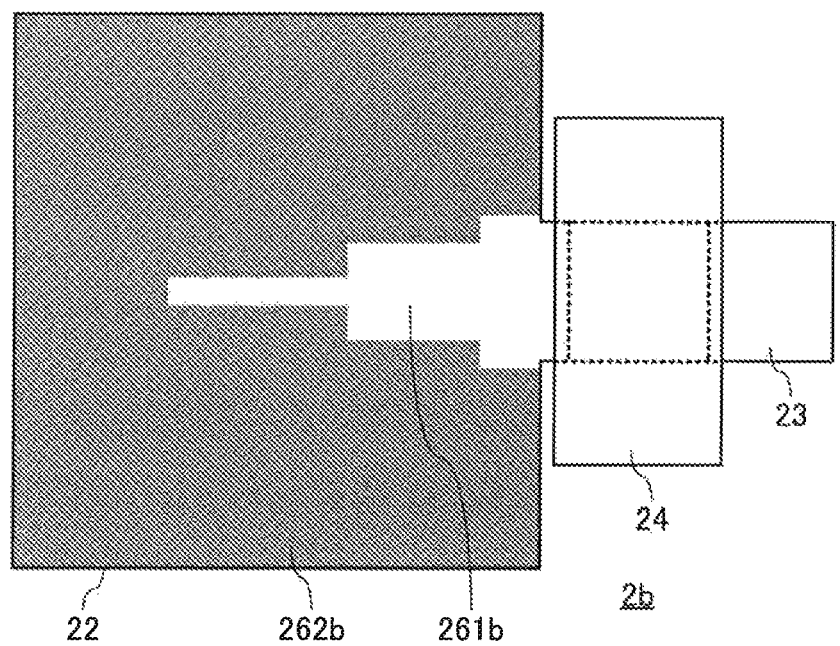
FIG. 13 is a view showing a second example of a solid-state imaging element according to the second embodiment of the present invention.

Next, a second example of the solid-state imaging element according to the second embodiment of the present invention will be described with reference to FIG. 13. FIG. 13 is a view showing the second example of the solid-state imaging element according to the second embodiment of the present invention. In addition, FIG. 13 corresponds to FIG. 12 (a) showing the first example of the solid-state imaging element according to the second embodiment of the present invention. Furthermore, the present example differs from the first example only in an implantation region and a non-implantation region, and the present and the first examples are the same other than that. Therefore, hereinafter, only a non-implantation region 261b and an implantation region 262b in the present example will be described, and as for the rest of it, the description in the first example of the second embodiment described above and FIG. 12 is to be occasionally used as references, and its description is omitted.

As shown in FIG. 13, according to the solid-state imaging element 2b in the present example, the non-implantation region 261b (the region corresponding to the implantation region 16b in the second example of the first embodiment shown in FIG. 4) has a shape in which its width discretely increases with the decreasing distance to the transfer section 24. In addition, the P-type low-concentration impurity region 221 has the same shape as the non-implantation region 261b. On the other hand, the P-type high-concentration impurity region 222 has the same shape as the implantation region 262b.

Thus, when the accumulation region 22 is formed so as to have the above P-type low-concentration impurity region 221, the potential in the accumulation region 22 can be inclined so as to be lowered with the decreasing distance to the transfer section 24. Therefore, it becomes possible to accelerate the movement of the electrons accumulated in the accumulation region 22 to the transfer section 24.

<Third Example>

Figure 14:
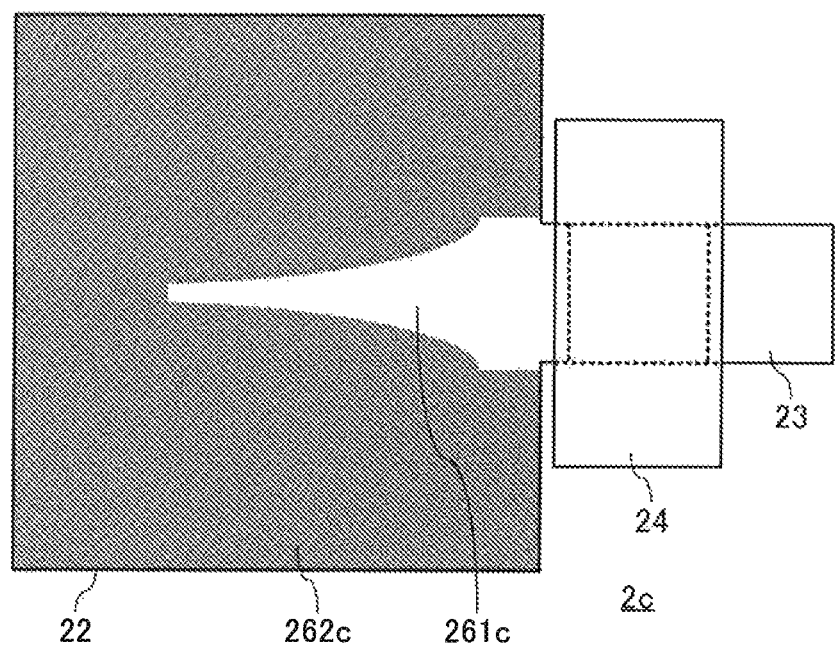
FIG. 14 is a view showing a third example of a solid-state imaging element according to the second embodiment of the present invention.

Next, a third example of the solid-state imaging element according to the second embodiment of the present invention will be described with reference to FIG. 14. FIG. 14 is a view showing the third example of the solid-state imaging element according to the second embodiment of the present invention. In addition, FIG. 14 corresponds to FIG. 12 (*a*) showing the first example of the solid-state imaging element according to the second embodiment of the present invention. Furthermore, the present example differs from the first example only in a non-implantation region and an implantation region, and the present and the first examples are the same other than that. Therefore, hereinafter, only a non-implantation region 261*c* and an implantation region 262*c* in the present example will be described, and as for the rest of it, the description in the first example of the second embodiment described above and FIG. 12 is to be occasionally used as references, and its description is omitted.

As shown in FIG. 14, according to a solid-state imaging element 2*c* in the present example, the non-implantation region 261*c* (the region corresponding to the implantation region 16*c* in the third example of the first embodiment shown in FIG. 5) has a shape in which its width continuously and exponentially increases with the decreasing distance to the transfer section 24. In addition, the P-type low-concentration impurity region 221 has the same shape as the non-implantation region 261*c*. On the other hand, the P-type high-concentration impurity region 222 has the same shape as the implantation region 262*c*.

Thus, when the accumulation region 22 is formed so as to have the above P-type low-concentration impurity region 221, the potential in the accumulation region 22 can be inclined so as to be lowered with the decreasing distance to the transfer section 24. Therefore, it becomes possible to accelerate the movement of the electrons accumulated in the accumulation region 22 to the transfer section 24.

Furthermore, according to the solid-state imaging element 2*c* in the present example, the potential in the accumulation region 22 can be smoothly inclined. Therefore, the electrons accumulated in the accumulation region 22 can be smoothly moved to the transfer section 24.

<Fourth Example>

Figure 15:
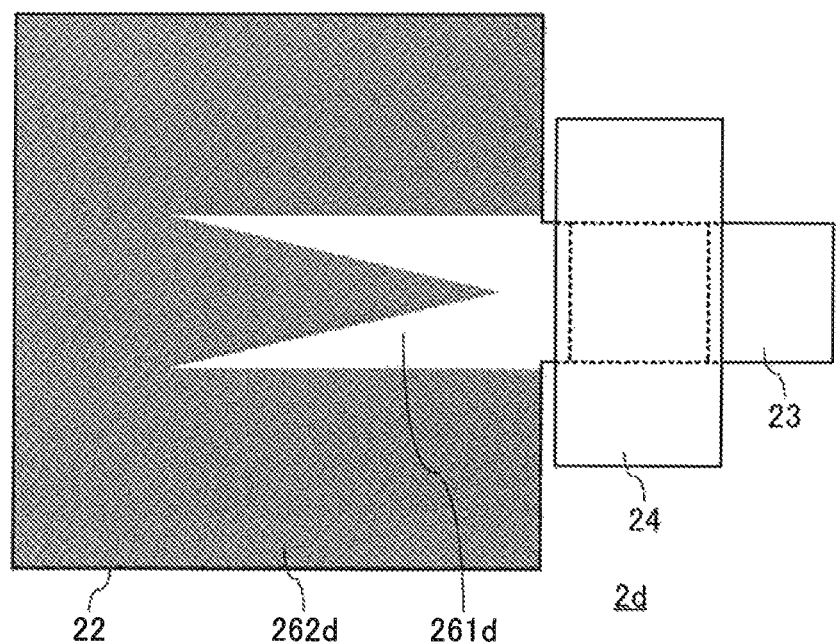
FIG. 15 is a view showing a fourth example of a solid-state imaging element according to the second embodiment of the present invention.

Next, a fourth example of the solid-state imaging element according to the second embodiment of the present invention will be described with reference to FIG. 15. FIG. 15 is a view showing the fourth example of the solid-state imaging element according to the second embodiment of the present invention. In addition, FIG. 15 corresponds to FIG. 12 (*a*) showing the first example of the solid-state imaging element according to the second embodiment of the present invention. Furthermore, the present example differs from the first example only in a non-implantation region and an implantation region, and the present and the first examples are the same other than that. Therefore, hereinafter, only a non-implantation region 261*d* and an implantation region 262*d* in the present example will be described, and as for the rest of it, the description in the first example of the second embodiment described above and FIG. 12 is to be occasionally used as references, and its description is omitted.

As shown in FIG. 15, according to a solid-state imaging element 2*d* in the present example, the non-implantation region 261*d* (the region corresponding to the implantation region 16*d* in the fourth example of the first embodiment shown in FIG. 6) has a shape in which the non-implantation region 261*d* branches into two parts in a direction being away from the transfer section 24, and a width of each branch continuously and linearly increases with the decreasing distance to the transfer section 24. In addition, the P-type low-concentration impurity region 221 has the same shape as the non-implantation region 261*d*. On the other hand, the P-type high-concentration impurity region 222 has the same shape as the implantation region 262*d*.

Thus, when the accumulation region 22 is formed so as to have the above P-type low-concentration impurity region 221, the potential in the accumulation region 22 can be inclined so as to be lowered with the decreasing distance to the transfer section 24. Therefore, it becomes possible to accelerate the movement of the electrons accumulated in the accumulation region 22 to the transfer section 24.

Furthermore, according to the solid-state imaging element 2*d* in the present example, the potential in the accumulation region 22 can be smoothly inclined. Therefore, the electrons accumulated in the accumulation region 22 can be smoothly moved to the transfer section 24. Furthermore, according to the solid-state imaging element 2*d* in the present example, the potential can be inclined in a large range of the accumulation region 22. Therefore, it becomes possible to effectively accelerate the movement of the electrons accumulated in the accumulation region 22 to the transfer section 24.

<Fifth Example>

Figure 16:
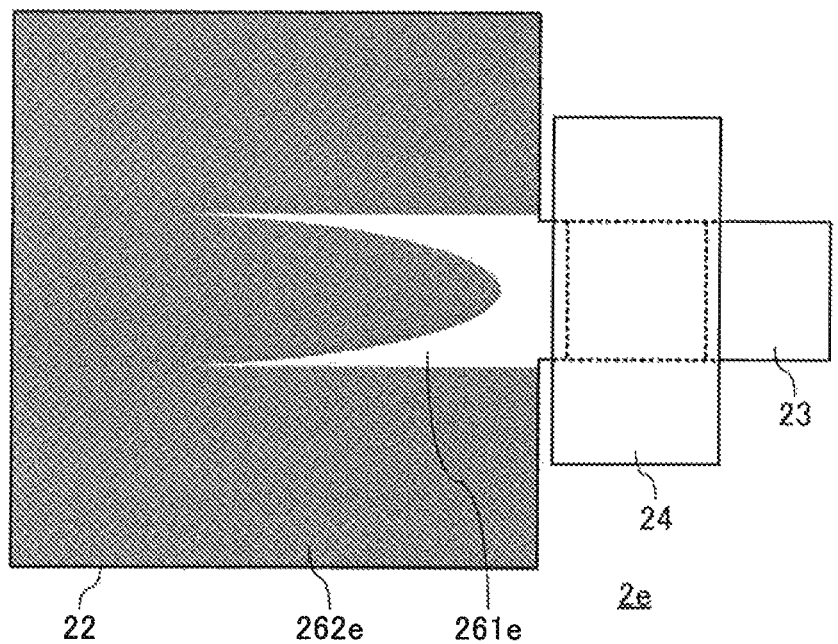
FIG. 16 is a view showing a fifth example of a solid-state imaging element according to the second embodiment of the present invention.

Next, a fifth example of the solid-state imaging element according to the second embodiment of the present invention will be described with reference to FIG. 16. FIG. 16 is a view showing the fifth example of the solid-state imaging element according to the second embodiment of the present invention. In addition, FIG. 16 corresponds to FIG. 12 (*a*) showing the first example of the solid-state imaging element according to the second embodiment of the present invention. Furthermore, the present example differs from the first example only in a non-implantation region and an implantation region, and the present and the second examples are the same other than that. Therefore, hereinafter, only a non-implantation region 261*e* and an implantation region 262*e* in the present example will be described, and as for the rest of it, the description in the first example of the second embodiment described above and FIG. 12 is to be occasionally used as references, and its description is omitted.

As shown in FIG. 16, according to a solid-state imaging element 2*e* in the present example, the non-implantation region 261*e* (the region corresponding to the implantation region 16*e* in the fifth example of the first embodiment shown in FIG. 7) has a shape in which the non-implantation region 261*e* branches into two parts in the direction being away from the transfer section 24, and a width of each branch continuously and exponentially increases with the decreasing distance to the transfer section 24. In addition, the P-type low-concentration impurity region 221 has the same shape as the non-implantation region 261*e*. On the other hand, the P-type high-concentration impurity region 222 has the same shape as the implantation region 262*e*.

Thus, when the accumulation region 22 is formed so as to have the above P-type low-concentration impurity region 221, the potential in the accumulation region 22 can be inclined so as to be lowered with the decreasing distance to the transfer section 24. Therefore, it becomes possible to accelerate the movement of the electrons accumulated in the accumulation region 22 to the transfer section 24.

Furthermore, according to the solid-state imaging element 2*e* in the present example, the potential in the accumulation region 22 can be smoothly inclined. Therefore, the electrons accumulated in the accumulation region 22 can be smoothly moved to the transfer section 24. Furthermore, according to the solid-state imaging element 2*e* in the present example, the potential can be inclined in a large range of the accumulation region 22. Therefore, it becomes possible to effectively accelerate the movement of the electrons accumulated in the accumulation region 22 to the transfer section 24.

<Sixth Example>

Figure 17:
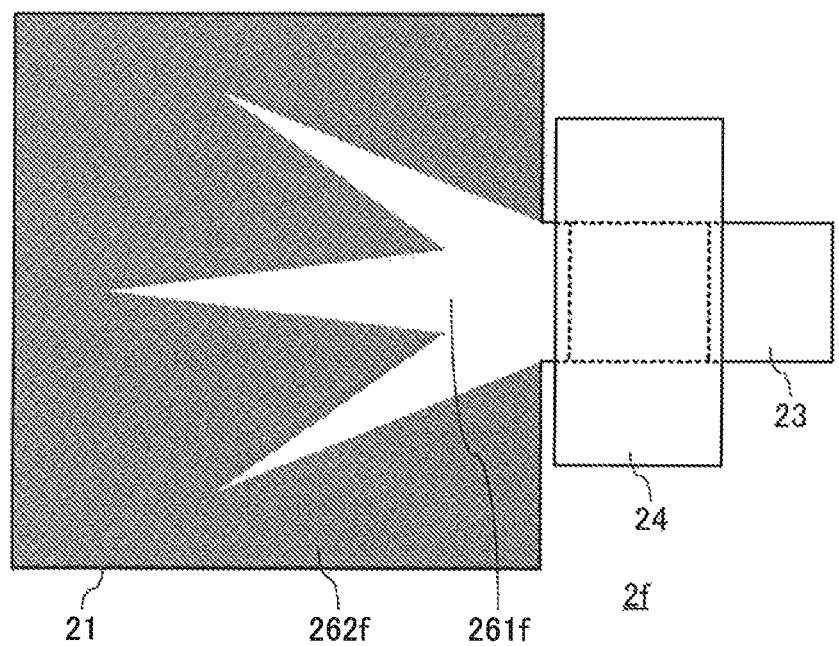
FIG. 17 is a view showing a sixth example of a solid-state imaging element according to the second embodiment of the present invention.

Next, a sixth example of the solid-state imaging element according to the second embodiment of the present invention will be described with reference to FIG. 17. FIG. 17 is a view showing the sixth example of the solid-state imaging element according to the second embodiment of the present invention. In addition, FIG. 17 corresponds to FIG. 12 (a) showing the first example of the solid-state imaging element according to the second embodiment of the present invention. Furthermore, the present example differs from the first example only in a non-implantation region and an implantation region, and the present and the first examples are the same other than that. Therefore, hereinafter, only a non-implantation region 261f and an implantation region 262f in the present example will be described, and as for the rest of it, the description in the first example of the second embodiment described above and FIG. 12 is to be occasionally used as references, and its description is omitted.

As shown in FIG. 17, according to a solid-state imaging element 2f in the present example, the non-implantation region 261f (the region corresponding to the implantation region 16f in the sixth example of the first embodiment shown in FIG. 8) has a shape in which the non-implantation region 261f branches into three parts in the direction being away from the transfer section 24, and a width of each branch continuously and lineally increases with the decreasing distance to the transfer section 24. In addition, the P-type low-concentration impurity region 221 has the same shape as the non-implantation region 261f. On the other hand, the P-type high-concentration impurity region 222 has the same shape as the implantation region 262f.

Thus, when the accumulation region 22 is formed so as to have the above P-type low-concentration impurity region 221, the potential in the accumulation region 22 can be inclined so as to be lowered with the decreasing distance to the transfer section 24. Therefore, it becomes possible to accelerate the movement of the electrons accumulated in the accumulation region 22 to the transfer section 24.

Furthermore, according to the solid-state imaging element 2f in the present example, the potential in the accumulation region 22 can be smoothly inclined. Therefore, the electrons accumulated in the accumulation region 22 can be smoothly moved to the transfer section 24. Furthermore, according to the solid-state imaging element 2f in the present example, the potential can be inclined in a large range of the accumulation region 22. Therefore, it becomes possible to effectively accelerate the movement of the electrons accumulated in the accumulation region 22 to the transfer section 24.

<Seventh Example>

Figure 18:
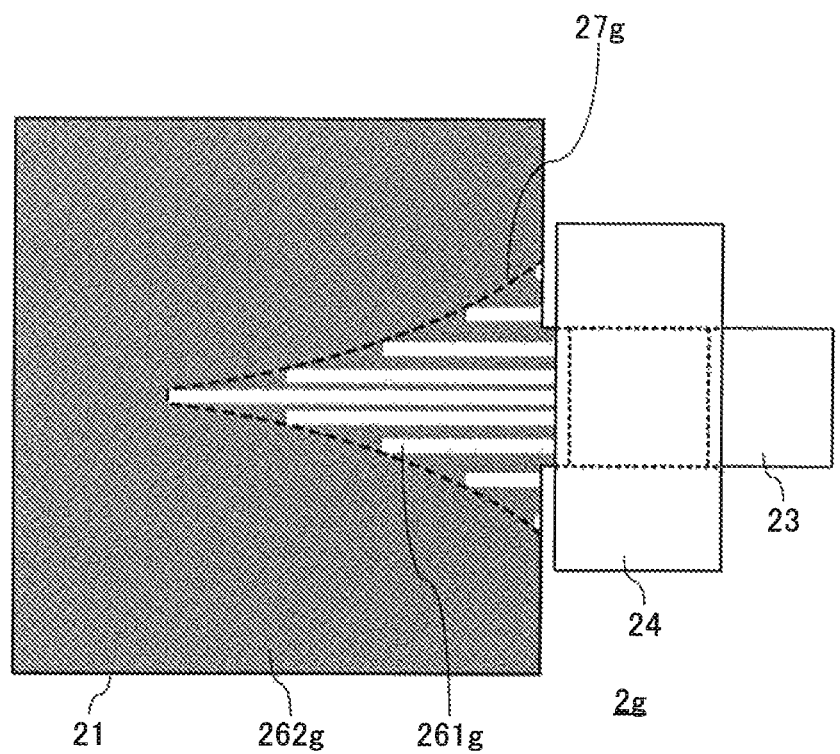
FIG. 18 is a view showing a seventh example of a solid-state imaging element according to the second embodiment of the present invention.

Next, a seventh example of the solid-state imaging element according to the second embodiment of the present invention will be described with reference to FIG. 18. FIG. 18 is a view showing the seventh example of the solid-state imaging element according to the second embodiment of the present invention. In addition, FIG. 18 corresponds to FIG. 12 (a) showing the first example of the solid-state imaging element according to the second embodiment of the present invention. Furthermore, the present example differs from the first example only in a non-implantation region and an implantation region, and the present and the first examples are the same other than that. Therefore, hereinafter, only a non-implantation region 261g and an implantation region 262g in the present example will be described, and as for the rest of it, the description in the first example of the second embodiment described above and FIG. 12 is to be occasionally used as references, and its description is omitted.

As shown in FIG. 18, according to a solid-state imaging element 2g in the present example, a plurality of the non-implantation regions 261g (the region corresponding to the implantation regions 16g in the seventh example of the first embodiment shown in FIG. 9) has a shape in which bars extend in parallel to the direction being away from the transfer section 24. Furthermore, as for the plurality of the non-implantation regions 261g, an interval between the adjacent non-implantation regions 261g becomes narrow with the decreasing distance to a center of the transfer section 24 among the non-implantation regions 261g. In addition, the P-type low-concentration impurity region 221 has the same shape as the non-implantation region 261g. On the other hand, the P-type high-concentration impurity region 222 has the same shape as the implantation region 262g. Furthermore, FIG. 18 also shows an outline region 27g surrounded by an outline enclosing a plurality of the P-type low-concentration impurity regions 221 (non-implantation regions 261g).

According to the solid-state imaging element 2g in the present example, a width of the outline region 27g continuously and exponentially increases with the decreasing distance to the transfer section 24. Thus, an area (total area) of a plurality of the P-type low-concentration impurity regions 221 (non-implantation regions 261g) per unit distance with respect to the transfer section 24 increases with the decreasing distance to the transfer section 24, as a whole. As a result, the potential in the accumulation region 22 can be inclined so as to accelerate the movement of the electrons accumulated in the accumulation region 22 to the transfer section 24. Therefore, according to the solid-state imaging element 2g in the present example, it becomes possible to accelerate the movement of the electrons accumulated in the accumulation region 22 to the transfer section 24.

Furthermore, according to the solid-state imaging element 2g in the present example, the potential in the accumulation region 22 can be smoothly inclined. Therefore, the electrons accumulated in the accumulation region 22 can be smoothly moved to the transfer section 24.

In addition, according to the solid-state imaging element 2g in the present example, a density of the P-type low-concentration impurity regions 221 increases with the decreasing distance to the transfer section 24. Thus, since the density of the P-type low-concentration impurity regions 221 increases with the decreasing distance to the transfer section 24, the potential in the accumulation region 22 can be inclined so as to accelerate the movement of the electrons accumulated in the accumulation region 22 to the transfer section 24. Therefore, according to the solid-state imaging element 2g in the present example, it becomes possible to accelerate the movement of the electrons accumulated in the accumulation region 22 to the transfer section 24.

<Eighth Example>

Figure 19:
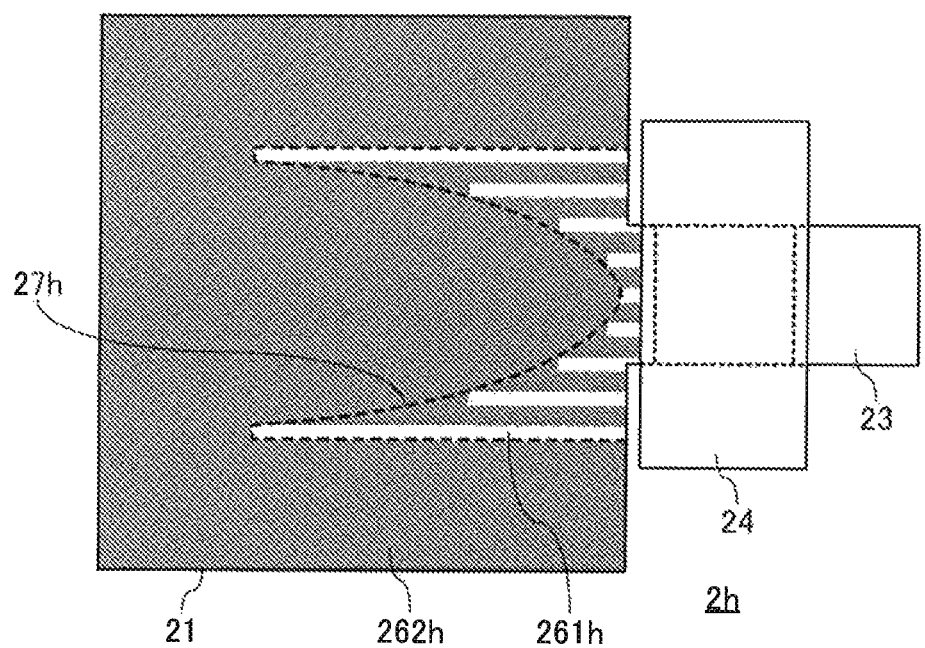
FIG. 19 is a view showing an eighth example of a solid-state imaging element according to the second embodiment of the present invention.

Next, an eighth example of the solid-state imaging element according to the second embodiment of the present invention will be described with reference to FIG. 19. FIG. 19 is a view showing the eighth example of the solid-state imaging element according to the second embodiment of the present invention. In addition, FIG. 19 corresponds to FIG. 12 (a) showing the first example of the solid-state imaging element according to the second embodiment of the present invention. Furthermore, the present example differs from the first example only in a non-implantation region and an implantation region, and the present and the first examples are the same other than that. Therefore, hereinafter, only a non-implantation region 261h and an implantation region 262h in the present example will be described, and as for the rest of it, the description in the first example of the second embodiment described above and FIG. 12 is to be occasionally used as references, and its description is omitted.

As shown in FIG. 19, according to a solid-state imaging element 2h in the present example, a plurality of the non-implantation regions 261h (the region corresponding to the implantation region 16h in the eighth example of the first embodiment shown in FIG. 10) have a shape in which bars extend in parallel to the direction being away from the transfer section 24. In addition, an interval between the adjacent non-implantation regions 261h is equal. In addition, the P-type low-concentration impurity region 221 has the same shape as the non-implantation region 261h. On the other hand, the P-type high-concentration impurity region 222 has the same shape as the implantation region 262h. Furthermore, FIG. 19 also shows an outline region 27h surrounded by an outline enclosing the plurality of the P-type low-concentration impurity regions 221 (non-implantation regions 261h).

According to the solid-state imaging element 2h in the present example, the outline region 27h branches into two parts in the direction being away from the transfer section 24, and a width of each branch continuously and exponentially increases with the decreasing distance to the transfer section 24. Thus, an area (total area) of the plurality of the P-type low-concentration impurity regions 221 (the non-implantation regions 261h) per unit distance with respect to the transfer section 24 increases with the decreasing distance to the transfer section 24, as a whole. As a result, the potential in the accumulation region 22 can be inclined so as to accelerate the movement of the electrons accumulated in the accumulation region 22 to the transfer section 24. Therefore, according to the solid-state imaging element 2h in the present example, it becomes possible to accelerate the movement of the electrons accumulated in the accumulation region 22 to the transfer section 24.

Furthermore, according to the solid-state imaging element 2h in the present example, the potential in the accumulation region 22 can be smoothly inclined. Therefore, the electrons accumulated in the accumulation region 22 can be smoothly moved to the transfer section 24. In addition, according to the solid-state imaging element 2h in the present example, the potential can be inclined in a large range of the accumulation region 22. Therefore, it becomes possible to effectively accelerate the movement of the electrons accumulated in the accumulation region 22 to the transfer section 24.

<Ninth Example>

Figure 20:
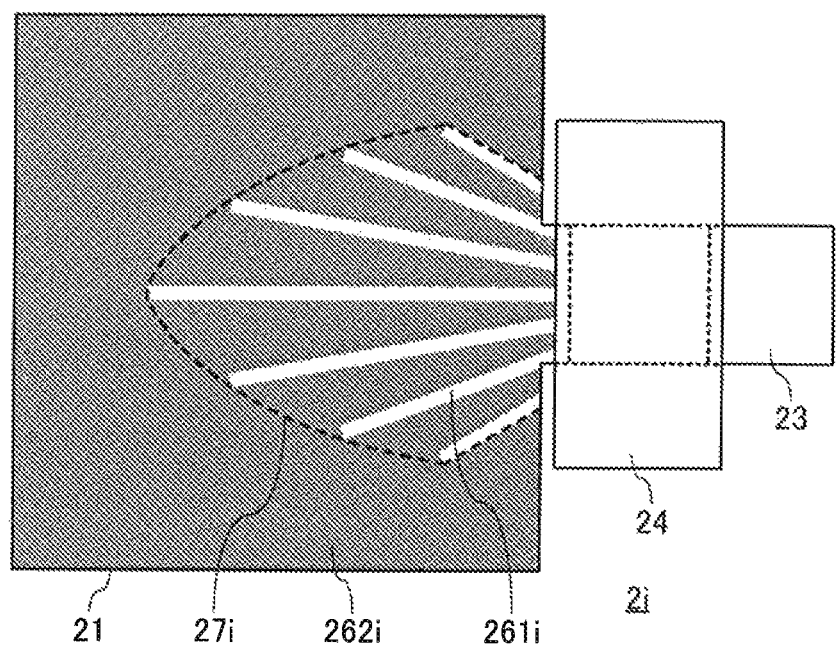
FIG. 20 is a view showing a ninth example of a solid-state imaging element according to a second embodiment of the present invention.

Next, a ninth example of the solid-state imaging element according to the second embodiment of the present invention will be described with reference to FIG. 20. FIG. 20 is a view showing the ninth example of the solid-state imaging element according to the second embodiment of the present invention. In addition, FIG. 20 corresponds to FIG. 12 (a) showing the first example of the solid-state imaging element according to the second embodiment of the present invention. Furthermore, the present example differs from the first example only in a non-implantation region and an implantation region, and the present and the first examples are the same other than that. Therefore, hereinafter, only a non-implantation region 261i and an implantation region 262i in the present example will be described, and as for the rest of it, the description in the first example of the second embodiment described above and FIG. 12 is to be occasionally used as references, and its description is omitted.

As shown in FIG. 20, according to the solid-state imaging element 2i in the present example, a plurality of the non-implantation regions 261i (the regions corresponding to the implantation regions 16i in the ninth example of the first embodiment shown in FIG. 11) have a shape in which bars extend radially in the direction being away from the transfer section 24. Furthermore, the P-type low-concentration impurity region 221 has the same shape as the non-implantation region 261i. On the other hand, the P-type high-concentration impurity region 222 has the same shape as the implantation region 262i. Furthermore, FIG. 20 also shows an outline region 27i surrounded by an outline enclosing the plurality of the P-type low-concentration impurity regions 221 (non-implantation region 261i).

According to the solid-state imaging element 2i in the present example, a density of the P-type low-concentration impurity regions 221 increases with the decreasing distance to the transfer section 24. Thus, since the density of the P-type low-concentration impurity regions 221 increases with the decreasing distance to the transfer section 24, the potential in the accumulation region 22 can be inclined so as to accelerate the movement of the electrons accumulated in the accumulation region 22 to the transfer section 24. Therefore, according to the solid-state imaging element 2i in the present example, it becomes possible to accelerate the movement of the electrons accumulated in the accumulation region 22 to the transfer section 24.

<Each Example of the Second Embodiment>

As described above, as for the solid-state imaging elements 2a to 2i according to the second embodiment of the present invention, the area per unit distance with respect to the transfer section 24 or the density of the P-type low-concentration impurity regions 221 formed in the accumulation region 22 (the non-implantation regions 261a to 261i of the P-type impurity in the accumulation region 22) is only adjusted so that the area or the density can increase with the decreasing distance to the transfer section 24. As a result, the potential in the accumulation region 22 can be inclined so as to accelerate the movement of the electrons accumulated in the accumulation region 22 to the transfer section 24. Therefore, the solid-state imaging elements 2a to 2i according to the second embodiment of the present invention can be simply manufactured.

Furthermore, it is possible to steplessly adjust the area per unit distance with respect to the transfer section 24 or the density of the P-type low-concentration impurity region 221 formed in the accumulation region 22 (the non-implantation regions 261a to 261i of the P-type impurity in the accumulation region 22). Therefore, as for the solid-state imaging elements 2a to 2i according to the second embodiment of the present invention, the potential in the accumulation region 22 can be inclined in a desired manner, and the movement of the electrons in the accumulation region 22 can be controlled with a high degree of accuracy.

In addition, as for the first example to the ninth example (FIGS. 12 to 20), each of the implantation regions 262a to 262i may be set so as to partially protrude outside the accumulation region 22 (outside an active region or onto an element isolation region, for example).

Furthermore, the description has been given to the case where the non-implantation regions 261d to 261f branch into the two or three parts in the fourth example to the sixth example (FIGS. 15 to 17), but each of them may branch into four or more parts. Furthermore, the branched non-implantation region may have a shape in which its width discretely increases with the decreasing distance to the transfer section 24 (refer to the second example in the second embodiment shown in FIG. 13). In addition, the branched non-implantation region is not always required to have the same shape, and it may have a different shape.

Furthermore, each of the outline regions 27g to 27i in the seventh example to the ninth example (FIGS. 18 to 20) may have any shape. For example, each of the outline regions 27g to 27i may have the same shape as the P-type low-concentration impurity regions 221 (the non-implantation regions 261a to 261f) in the first example to the sixth example in the second embodiment (including the above-described variation). Furthermore, the description has been given to the case where each of the shapes of the P-type low-concentration impurity regions 221 (the non-implantation regions 261g to 261i) has the bar shape, but it may have a shape other than the bar shape.

<<Variation>>

The description has been given to the case where the N-type accumulation regions 12 and 22 are formed in the P-type substrates 11 and 21, respectively (in the case where the electrons are accumulated in the accumulation regions 12 and 22), but the P type and the N type may be reversed. That is, a P-type accumulation region may be formed in an N-type substrate (holes are accumulated in the accumulation region). In this case, as for the solid-state imaging elements 1a to 1i according to the first embodiment of the present invention, a P-type high-concentration impurity region (impurity concentration modulation region) is formed by implanting the P-type impurity in the implantation region corresponding to each of the implantation regions 16a to 16i. In addition, in this case, as for the solid-state imaging elements 2a to 2i according to the second embodiment of the present invention, an N-type low-concentration impurity region (impurity concentration modulation region) and an N-type high-concentration impurity region are formed by implanting the N-type impurity in the implantation region corresponding to each of the implantation regions 262a to 262i.

While the description has been given to the CMOS imaging sensor as the solid-state imaging elements 1a to 1i, and 2a to 2i according to the embodiments of the present invention, the present invention is applicable to a solid-state imaging element other than the CMOS imaging sensor (such as a CCD imaging sensor).

INDUSTRIAL APPLICABILITY

The solid-state imaging element according to the present invention can be preferably used for a CMOS imaging sensor, a CCD imaging sensor, or the like which is mounted on any kind of electronic device having an imaging function.

DESCRIPTION OF SYMBOLS

1a to 1i Solid-state imaging element
11 Substrate
12 Accumulation region
121 N-type high-concentration impurity region (impurity concentration modulation region)
13 Read-out region
14 Transfer section
15 Insulating film
16a to 16i Implantation region
17g to 17i Outline region
2a to 2i Solid-state imaging element
21 Substrate
22 Accumulation region
221 P-type high-concentration impurity region
222 P-type low-concentration impurity region (impurity concentration modulation region)
23 Read-out region
24 Transfer section
25 Insulating film
261a to 261i Non-implantation region
262a to 262i Implantation region
27g to 27i Outline region

The invention claimed is:

1. A solid-state imaging element comprising:
a substrate having a first conductivity type;
an accumulation region having a second conductivity type, opposite to the first conductivity type, in the substrate that accumulates electric charges generated by a photoelectric conversion;
a read-out region having the second conductivity type in the substrate that receives transferred electric charges accumulated in the accumulation region; and
a transfer section above a region between the accumulation region and the read-out region in the substrate that transfers the electric charges from the accumulation region to the read-out region, wherein
a plurality of impurity concentration modulation regions having a locally higher concentration of an impurity having the second conductivity type than a peripheral region, or having a locally lower concentration of an impurity having the first conductivity type than the peripheral region, are in the accumulation region,
the peripheral region is in the accumulation region, and
the plurality of the impurity concentration modulation regions extend parallel to a first direction away from the transfer section in a plane parallel to a surface of the substrate and, the closer a portion of the peripheral region in an outline region sandwiched by two adjacent impurity concentration modulation regions included in the plurality of the impurity concentration modulation regions is to a center line, the narrower a width of the portion of the peripheral region sandwiched by the two adjacent impurity concentration modulation regions is, the outline region being surrounded by an outline enclosing the plurality of the impurity concentration modulation regions, and the center line being parallel to the first direction and passing through a center of the transfer section.

2. The solid-state imaging element according to claim 1, wherein a width of the outline region surrounded by the outline enclosing the plurality of the impurity concentration modulation regions increases toward the transfer section, in the plane parallel to the surface of the substrate.

3. The solid-state imaging element according to claim 2, wherein the width of the outline region continuously increases toward the transfer section in the plane parallel to the surface of the substrate.

4. The solid-state imaging element according to claim 3, wherein the width of the outline region linearly or exponentially increases toward the transfer section in the plane parallel to the surface of the substrate.

5. The solid-state imaging element according to claim 1, wherein,
in the case where the concentration of the impurity having the second conductivity type is locally higher in the impurity concentration modulation regions than the peripheral region, the concentration of the impurity having the second conductivity type is uniform in the impurity concentration modulation regions, and
in the case where the concentration of the impurity having the first conductivity type is locally lower in the impurity concentration modulation regions than the peripheral region, the concentration of the impurity having the first conductivity type is uniform in the accumulation region other than the impurity concentration modulation regions.

* * * * *